United States Patent
Alsmeier

(10) Patent No.: US 9,754,667 B2
(45) Date of Patent: Sep. 5, 2017

(54) THREE-DIMENSIONAL NAND NON-VOLATILE MEMORY AND DRAM MEMORY DEVICES ON A SINGLE SUBSTRATE

(71) Applicant: SANDISK TECHNOLOGIES INC., Plano, TX (US)

(72) Inventor: Johann Alsmeier, San Jose, CA (US)

(73) Assignee: SanDisk Technologies LLC, Plano, TX (US)

( * ) Notice: Subject to any disclaimer, the term of this patent is extended or adjusted under 35 U.S.C. 154(b) by 39 days.

(21) Appl. No.: 14/935,188

(22) Filed: Nov. 6, 2015

(65) Prior Publication Data
US 2016/0064079 A1 Mar. 3, 2016

Related U.S. Application Data

(62) Division of application No. 14/465,149, filed on Aug. 21, 2014, now Pat. No. 9,208,883.

(60) Provisional application No. 61/869,578, filed on Aug. 23, 2013.

(51) Int. Cl.
| | |
|---|---|
| *G11C 14/00* | (2006.01) |
| *G11C 16/04* | (2006.01) |
| *H01L 27/108* | (2006.01) |
| *H01L 27/11551* | (2017.01) |
| *H01L 27/11578* | (2017.01) |
| *H01L 27/11524* | (2017.01) |
| *H01L 27/11556* | (2017.01) |
| *H01L 27/1157* | (2017.01) |
| *H01L 27/11582* | (2017.01) |

(52) U.S. Cl.
CPC ...... *G11C 14/0018* (2013.01); *G11C 16/0483* (2013.01); *H01L 27/10805* (2013.01); *H01L 27/10844* (2013.01); *H01L 27/10847* (2013.01); *H01L 27/10891* (2013.01); *H01L 27/1157* (2013.01); *H01L 27/11524* (2013.01); *H01L 27/11551* (2013.01); *H01L 27/11556* (2013.01); *H01L 27/11578* (2013.01); *H01L 27/11582* (2013.01)

(58) Field of Classification Search
CPC .... G11C 16/0483; G11C 2213/71; G11C 5/02
See application file for complete search history.

(56) References Cited

U.S. PATENT DOCUMENTS

| | | | |
|---|---|---|---|
| 7,605,037 B2 | 10/2009 | Weis | |
| 8,349,681 B2 | 1/2013 | Alsmeier et al. | |
| 9,129,681 B2 * | 9/2015 | Rabkin | ............... H01L 29/6675 |
| 2008/0173928 A1 | 7/2008 | Arai et al. | |

(Continued)

OTHER PUBLICATIONS

International Search Report and Written Opinion dated Nov. 13, 2014 in International Patent Application No. PCT/US2014/052425.

(Continued)

*Primary Examiner* — Tuan T Nguyen
(74) *Attorney, Agent, or Firm* — Vierra Magen Marcus LLP

(57) ABSTRACT

A three-dimensional NAND stacked non-volatile memory array and a DRAM memory array are provided. The three-dimensional NAND stacked non-volatile memory array and the DRAM memory array are integrated on a single substrate.

6 Claims, 19 Drawing Sheets

(56) References Cited

U.S. PATENT DOCUMENTS

| | | | | |
|---|---|---|---|---|
| 2008/0186771 A1* | 8/2008 | Katsumata | ......... | G11C 16/0483 |
| | | | | 365/185.17 |
| 2012/0147644 A1 | 6/2012 | Scheuerlein | | |
| 2013/0016558 A1* | 1/2013 | Ahn | ................... | G11C 16/3459 |
| | | | | 365/185.03 |
| 2013/0070506 A1* | 3/2013 | Kajigaya | .................. | G11C 7/18 |
| | | | | 365/51 |
| 2013/0107620 A1 | 5/2013 | Tanzawa | | |
| 2013/0272069 A1* | 10/2013 | Rabkin | ............... | H01L 29/6675 |
| | | | | 365/185.17 |
| 2013/0286747 A1* | 10/2013 | Kwak | .................... | G11C 16/10 |
| | | | | 365/185.22 |
| 2015/0071005 A1* | 3/2015 | Maejima | ................ | G11C 16/28 |
| | | | | 365/185.21 |

OTHER PUBLICATIONS

Requirement for Restriction/Election dated Jul. 8, 2015 in U.S. Appl. No. 14/465,149.
Response to Election/Restriction mailed Aug. 31, 2015 in U.S. Appl. No. 14/465,149.
Notice of Allowance and Fees Due dated Sep. 18, 2015 in U.S. App. No. 14/465,149.

* cited by examiner

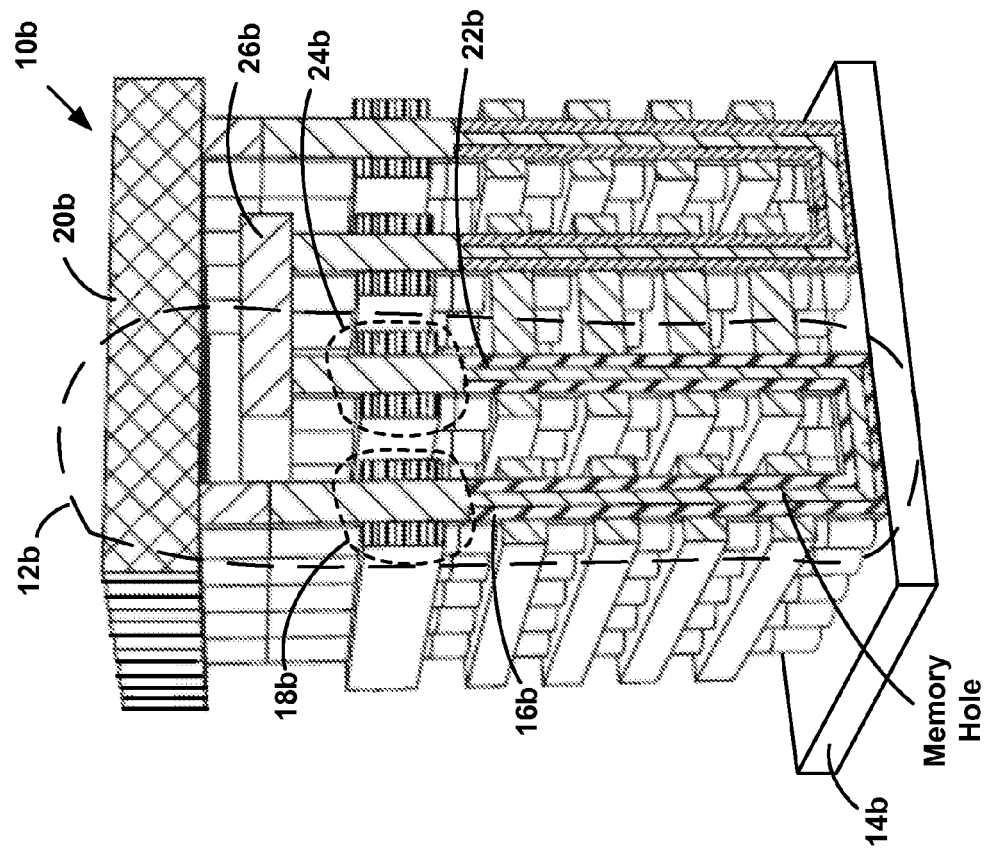
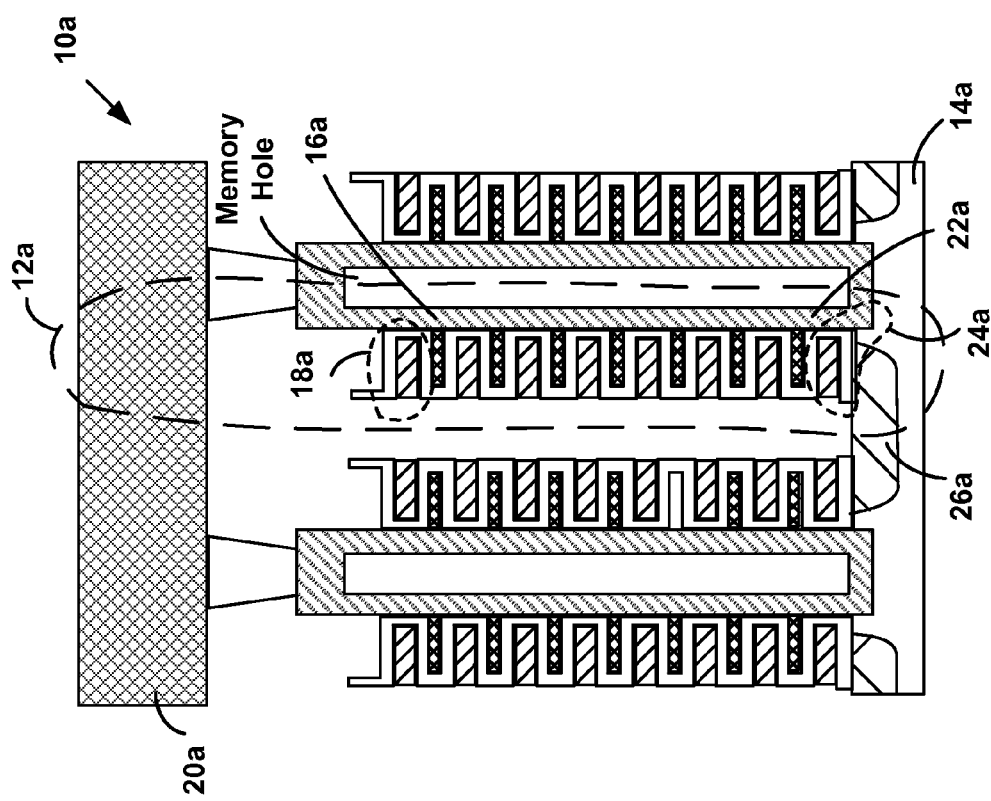

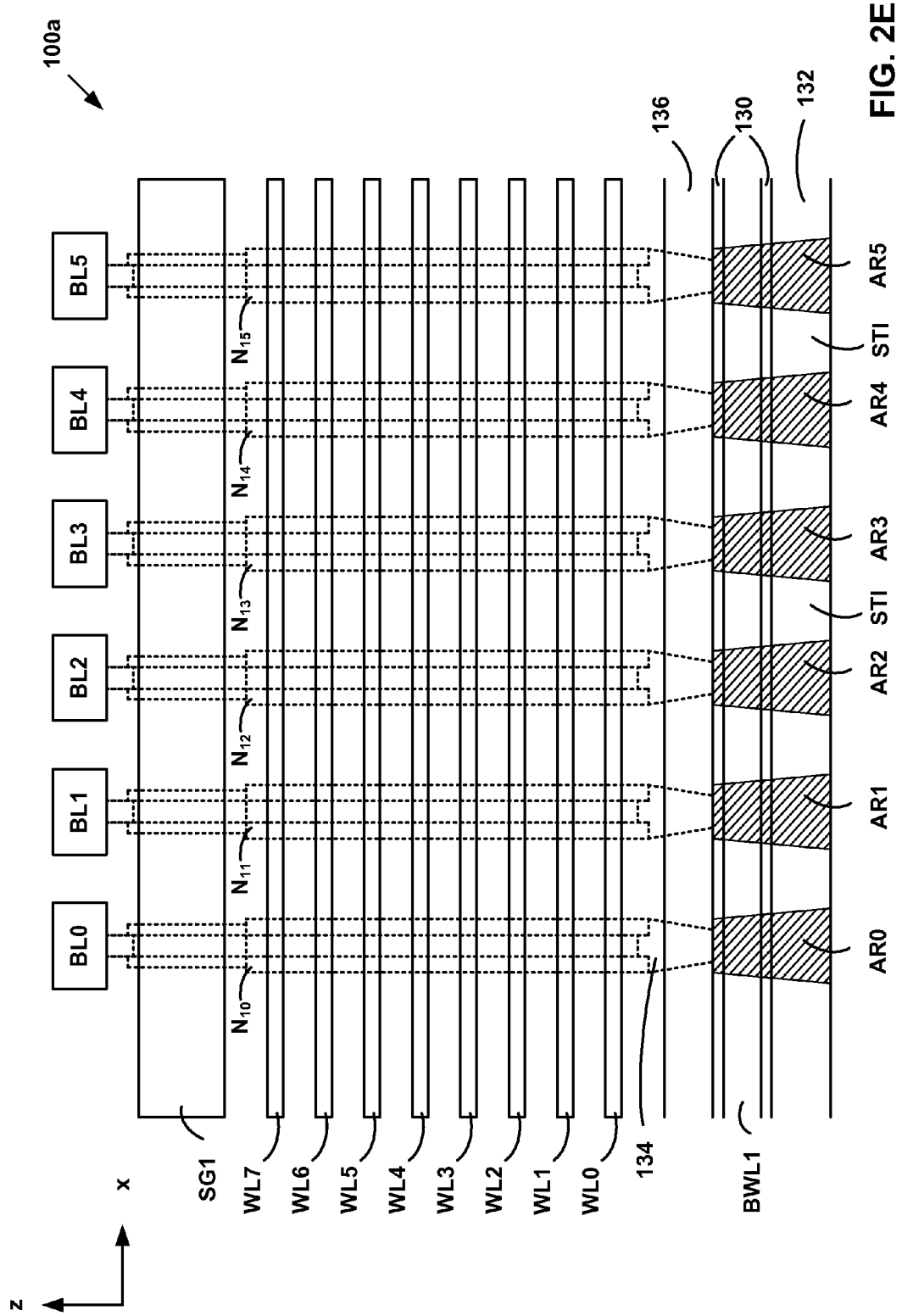

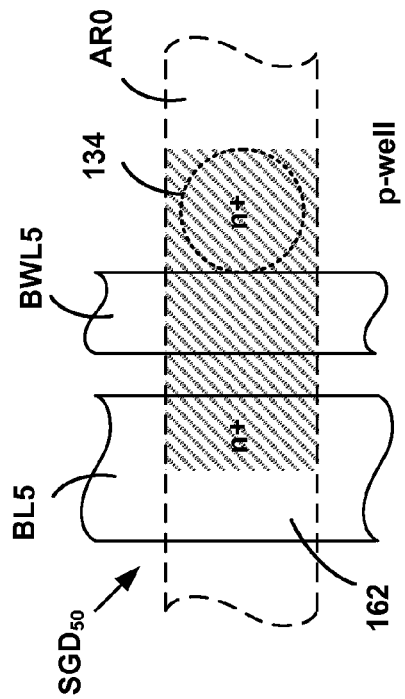
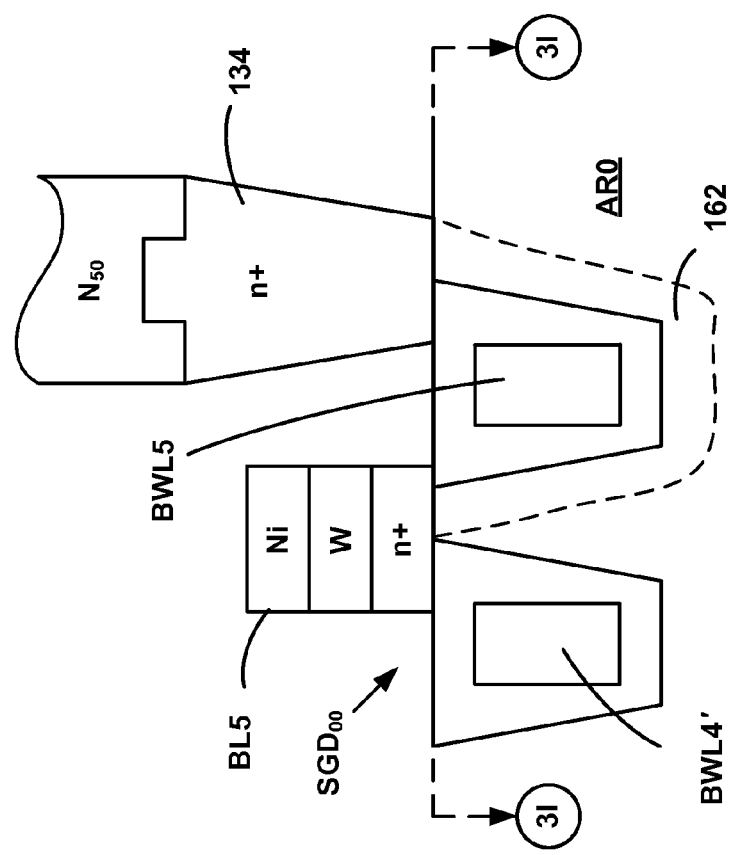

US 9,754,667 B2

THREE-DIMENSIONAL NAND NON-VOLATILE MEMORY AND DRAM MEMORY DEVICES ON A SINGLE SUBSTRATE

REFERENCE TO RELATED APPLICATIONS

This application is a divisional of U.S. patent application Ser. No. 14/465,149, filed on Aug. 21, 2014, which application claims the benefit of U.S. Provisional Patent Application Ser. No. 61/869,578, filed on Aug. 23, 2013, each of which are incorporated herein by reference in their entirety for all purposes.

BACKGROUND

The present technology relates to three-dimensional (3D) non-volatile memory devices. In particular, the present technology relates to 3D NAND non-volatile memory devices with buried word line selectors.

Recently, ultra-high density storage devices have been proposed using a 3D stacked memory structure. For example, a 3D NAND stacked non-volatile memory device can be formed from an array of alternating conductive and dielectric layers. A memory hole is drilled in the layers to define many memory layers simultaneously. A NAND string is then formed by filling the memory hole with appropriate materials. Control gates of the memory cells are provided by the conductive layers. Examples of such devices include Bit Cost Scalable (BiCS) memory, Terabit Cell Array Transistor (TCAT) and Vertical NAND (V-NAND).

However, various challenges are presented in designing and operating such memory devices.

BRIEF DESCRIPTION OF THE DRAWINGS

Like-numbered elements refer to common components in the different figures.

FIGS. 1A and 1B are perspective views of previously known 3D NAND stacked non-volatile memory devices.

FIGS. 2C-2E illustrate various cross-sectional views of the 3D NAND non-volatile memory device of FIGS. 2A-2B.

FIGS. 3F-3I illustrate close-up cross-sectional views of portions of the 3D NAND non-volatile memory device of FIGS. 3C-3E.

DETAILED DESCRIPTION

Figure 2A:
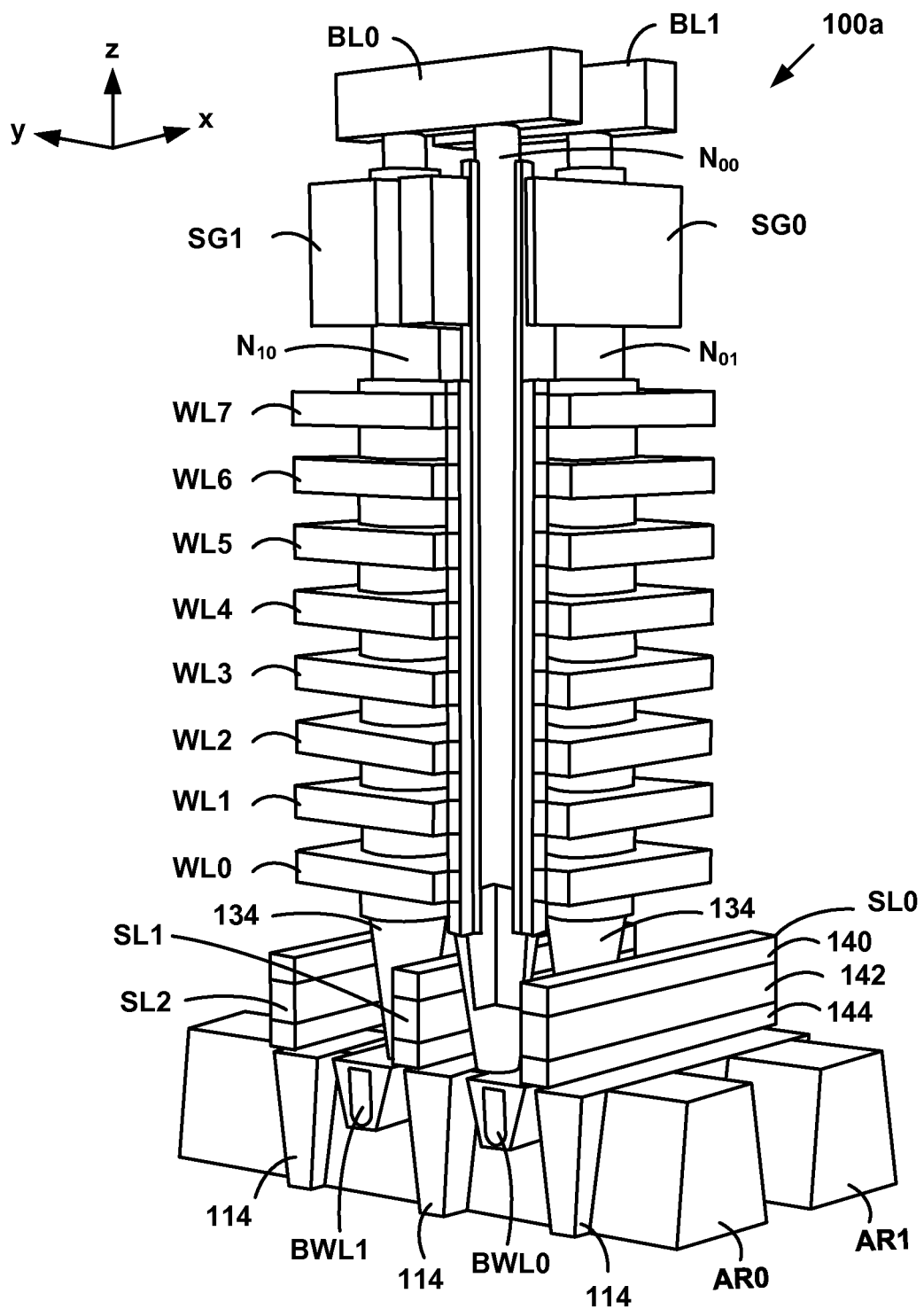
FIG. 2A is a perspective view of an embodiment of a 3D NAND non-volatile memory device.

A 3D NAND stacked non-volatile memory device may include an array of alternating conductive and dielectric layers disposed above a substrate. A memory hole is drilled in the layers to define many memory layers simultaneously. A NAND string is then formed by filling the memory hole with appropriate materials. Control gates of the memory cells are provided by the conductive layers. Each NAND string has a first "drain" end coupled via a drain-side select gate transistor ("SGD") to a bit line, and a second "source" end coupled via a source-side select gate transistor ("SGS") to a common source conductor. SGD and SGS may be used to selectively couple the drain and source ends, respectively, of a NAND string to the bit line and source line, respectively.

FIG. 1A illustrates a previously-known TCAT array 10a, and FIG. 1B illustrates a previously-known BiCS array 10b. TCAT array 10a includes a NAND string 12a disposed above a substrate 14a. NAND string 12a has a drain end 16a coupled via SGD 18a to a bit line 20a, and a source end 22a coupled via SGS 24a to a source line 26a. BiCS array 10b includes a NAND string 12b disposed above a substrate 14b. NAND string 12b has a drain end 16b coupled via SGD 18b to a bit line 20b, and a source end 22b coupled via SGS 24b to a source line 26b.

In each of the previously known 3D NAND memory arrays 10a and 10b, select gates SGD 16a and SGS 20a, and SGD 16b and SGS 20b are implemented above substrates 14a and 14b, respectively. In addition, in such previously known 3D NAND memory arrays 10a and 10b, SGD 16a and SGS 20a, and SGD 16b and SGS 20b consume a significant amount of area, and may limit the ability to achieve high-density memory arrays.

Unlike previously known 3D NAND non-volatile memory devices, such as those illustrated in FIGS. 1A and 1B, 3D NAND non-volatile memory devices are described that include select gate transistors (SGD or SGS) disposed in the substrate below the NAND strings. In particular, 3D NAND memory arrays are described that include buried word lines as selector devices of select gate transistors (SGD or SGS). Without wanting to be bound by any particular theory, such buried word line selector devices may be used to form high density 3D NAND non-volatile memory devices.

Figure 2B:
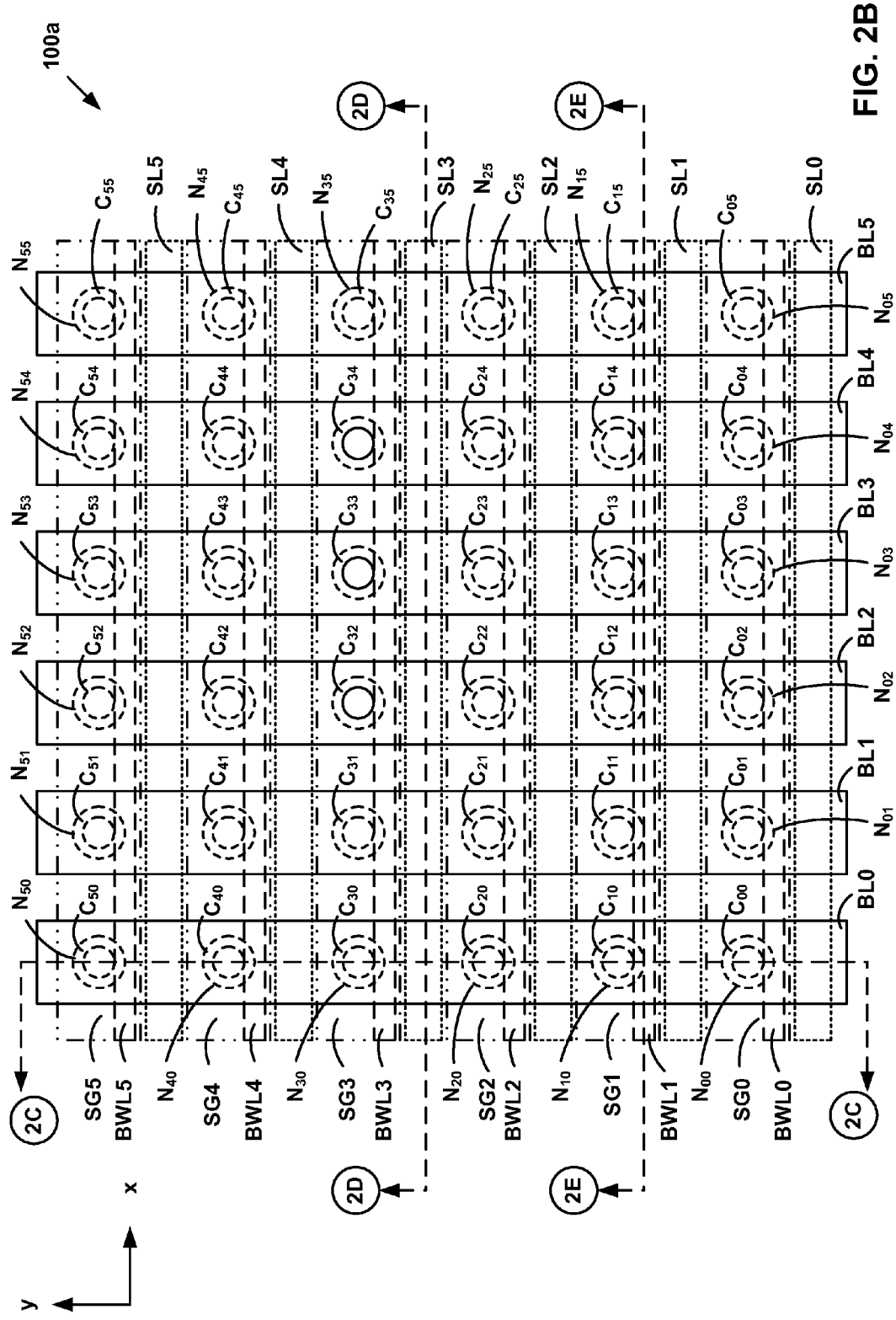
FIG. 2B illustrates a top view of the 3D NAND non-volatile memory device of FIG. 2A.
Figure 2C:
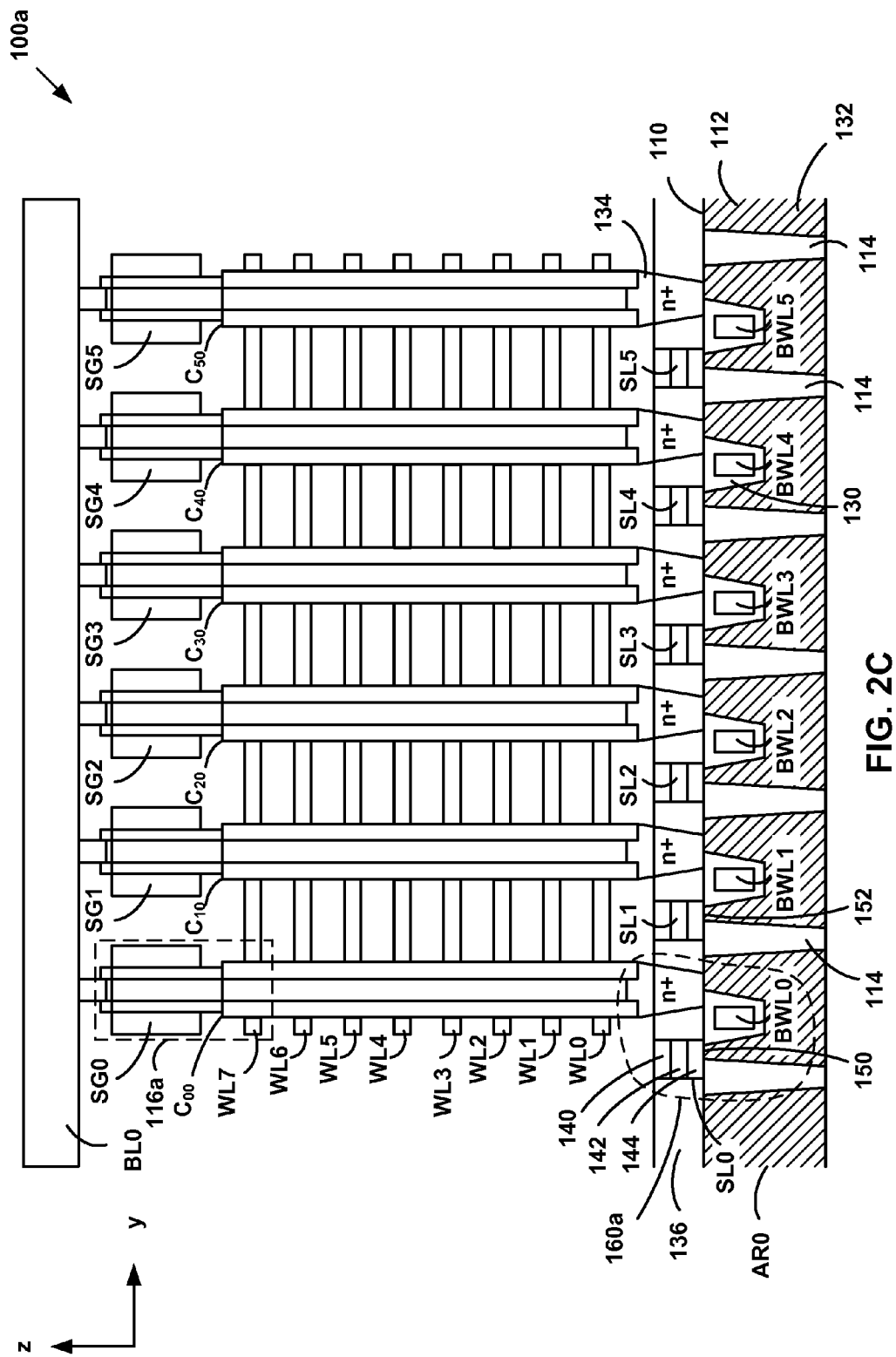
Figure 2D:
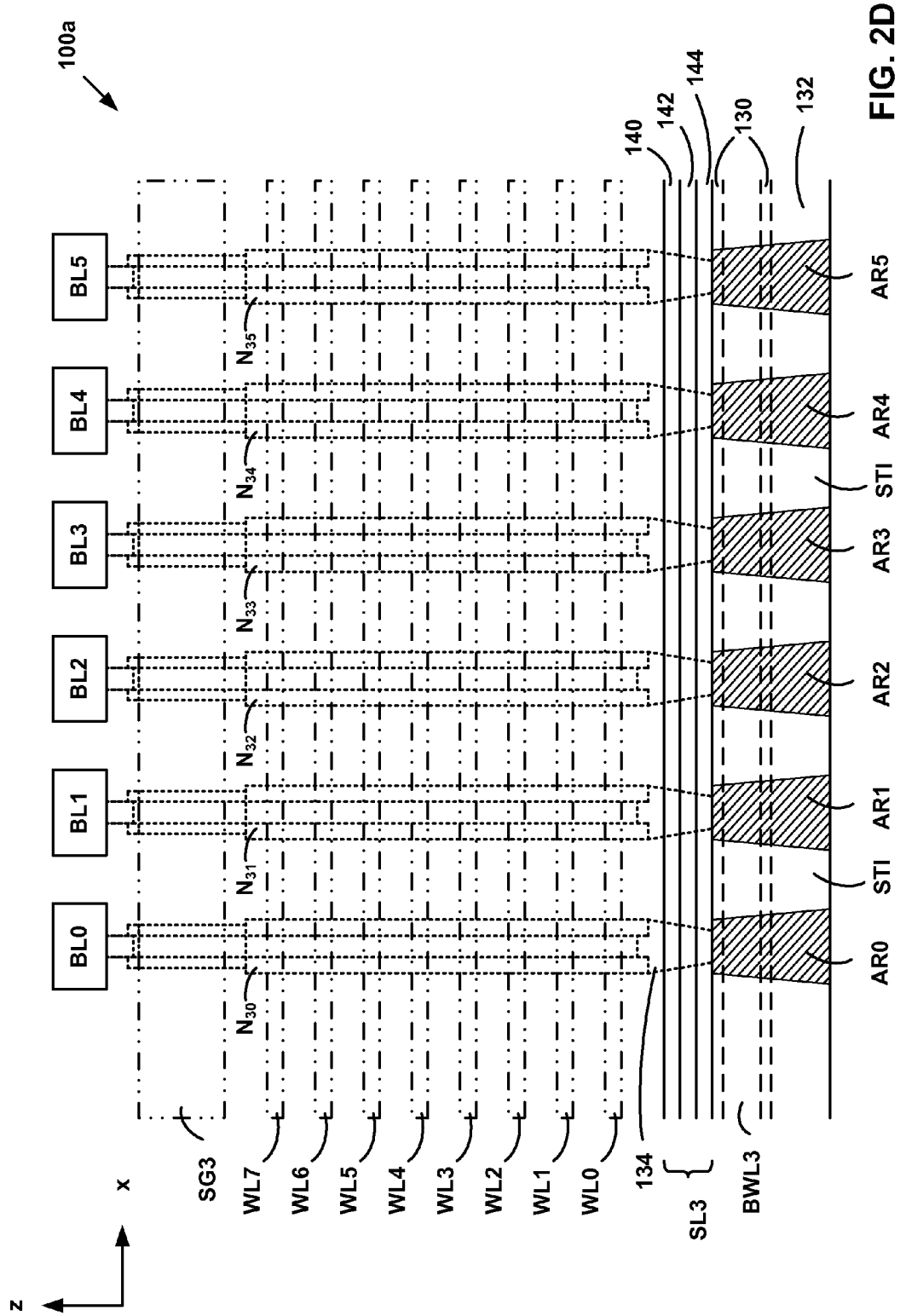

An embodiment of a 3D NAND non-volatile memory device with buried word line selectors is shown in FIGS. 2A-2I. FIG. 2A illustrates a perspective view of a portion of 3D NAND non-volatile memory device 100a. FIG. 2B illustrates a top view of 3D NAND non-volatile memory device 100a, FIGS. 2C-2E illustrate various cross-sectional views of 3D NAND non-volatile memory device 100a, and FIGS. 2F-2I illustrate close-up cross-sectional views of portions of 3D NAND non-volatile memory device 100a. 3D NAND non-volatile memory device 100a includes bit lines BL0, BL1, ..., BL5, vertical NAND strings $N_{00}$, $N_{01}$, ..., $N_{55}$, and source lines SL0, SL1, ..., SL5 disposed above a surface 110 of a substrate 112, and conductors BWL0, BWL1, ..., BWL5 disposed below surface 110 of substrate 112. In an embodiment, source lines SL0, SL1, ..., SL5 are connected to one another at a common source node (not shown).

Substrate 112 also includes active regions AR0, AR1, ..., AR5. In an embodiment, each of active regions AR0, AR1, ..., AR5 are segmented by isolation trenches (e.g., $SiO_2$) 114. In this embodiment, bit lines BL0, BL1, ..., BL5 are disposed above and are parallel to active regions AR0, AR1, . . . , AR5, and source lines SL0, SL1, . . . , SL5 are disposed above and are parallel to conductors BWL0, BWL1, . . . , BWL5. In addition, bit lines BL0, BL1, . . . , BL5 are perpendicular to conductors BWL0, BWL1, . . . , BWL5. In other embodiments, other configurations are possible. For example, active regions AR0, AR1, . . . , AR5 may be disposed at an angle relative to bit lines BL0, BL1, . . . , BL5, conductors BWL0, BWL1, . . . , BWL5, and source lines SL0, SL1, . . . , SL5.

Each of vertical NAND strings $N_{00}$, $N_{01}$, . . . , $N_{55}$ includes columns $C_{00}$, $C_{01}$, . . . , $C_{55}$, respectively, and alternating conductive layers and dielectric layers. Conductive layers include select gate layers SG0, SG1, . . . , SG5 and word line layers WL0, WL1, . . . , WL7. For example, vertical NAND string $N_{00}$ includes select gate layer SG0 and word line layers WL0, WL1, . . . , WL7, each separated from adjacent conductive layers by dielectric material layers (e.g., $SiO_2$ or other dielectric material) (not shown in FIGS. 2C-2E). Likewise, NAND string $N_{10}$ includes select gate layer SG1 and word line layers WL0, WL1, . . . , WL7, each separated from adjacent conductive layers by dielectric material layers (not shown in FIGS. 2C-2E). In an embodiment, word line layers WL0, WL1, . . . , WL7 are perpendicular to bit lines BL0, BL1, . . . , BL5.

Figure 2G:
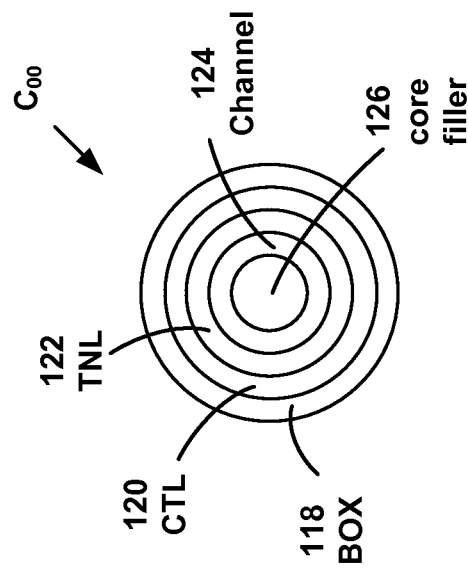
FIGS. 2F-2I illustrate close-up cross-sectional views of portions of the 3D NAND non-volatile memory device of FIGS. 2C-2E.
Figure 2F:
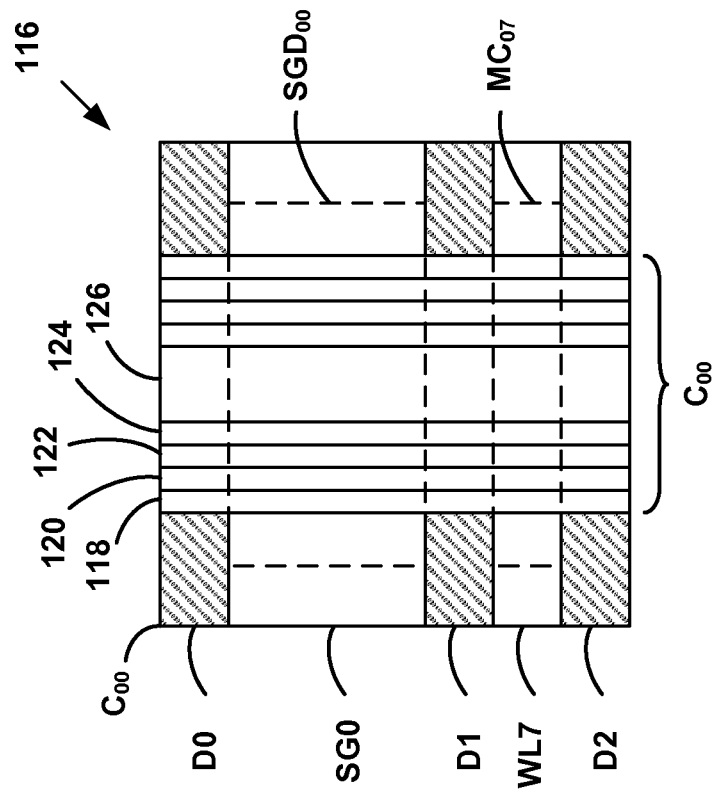

FIGS. 2F-2G depict a close-up view of region 116a of column $C_{00}$ of FIG. 2C, showing a drain side select gate transistor $SGD_{00}$ and a memory cell $MC_{07}$. Region 116a shows portions of dielectric material layers D0, D1 and D2, select gate layer SG0, and word line layer WL7. Each of columns $C_{00}$, $C_{01}$, . . . , $C_{55}$, includes a number of layers which are deposited along the sidewalls of the column. These layers may include oxide-nitride-oxide and polysilicon layers which may be deposited (e.g., using atomic layer deposition or other technique). For example, a block oxide (BOX) can be deposited as layer 118, a nitride such as SiN as a charge trapping layer (CTL) can be deposited as layer 120, a tunnel oxide (TNL) can be deposited as layer 122, a polysilicon body or channel (CH) can be deposited as layer 124, and a core filler dielectric can be deposited as region 126. Additional memory cells are similarly formed throughout columns $C_{00}$, $C_{01}$, . . . , $C_{55}$. In the embodiment shown in FIGS. 2A-2G, each of columns $C_{00}$, $C_{01}$, . . . , $C_{55}$ has a hollow cylinder shape. In other embodiments, each of columns $C_{00}$, $C_{01}$, . . . , $C_{55}$ may have a solid, rod shape.

Referring again to FIGS. 2A-2E, conductors BWL0, BWL1, . . . , BWL5 are disposed in dielectric trenches 130 (e.g., $SiO_2$ shallow trench isolation (STI) trenches) formed in a doped well 132 (e.g., p-well) in substrate 112. As used herein, conductors BWL0, BWL1, . . . , BWL5 will be referred to as "buried word lines" BWL0, BWL1, . . . , BWL. Persons of ordinary skill in the art will understand that three-dimensional NAND device 100a may include more or fewer bit lines BL0, BL1, . . . , BL5, vertical NAND strings $N_{00}$, $N_{01}$, . . . , $N_{55}$, source lines SL0, SL1, . . . , SL5, and buried word lines BWL0, BWL1, . . . , BWL5 than depicted in FIGS. 2A-2E.

Select gate layers SG0, SG1, . . . , SG5 form conductive paths to control select gate transistors of NAND strings $N_{00}$, $N_{01}$, . . . , $N_{55}$, and word lines WL0, WL1, . . . , WL7 form conductive paths to control gates of the memory cells at the layer. Conductive layers SG0, SG1, . . . , SG5 and WL0, WL1, . . . , WL7 may include conductive or semiconductor material, such as doped polysilicon or a metal, such as tungsten, copper, aluminum, tantalum, titanium, cobalt, titanium nitride or alloys, or other conductive material. Although vertical NAND strings $N_{00}$, $N_{01}$, . . . , $N_{55}$ are shown each including eight word line layers, person of ordinary skill in the art will understand that more or fewer than eight word line layers may be used.

Select gate layers SG0, SG1, . . . , SG5 may be used to selectively couple the "drain" ends of a NAND strings $N_{00}$, $N_{01}$, . . . , $N_{55}$ to one of bit lines BL0, BL1, . . . , BL5. For example, select gate layer SG0 may be used to selectively couple NAND strings $N_{00}$, $N_{01}$, $N_{02}$, $N_{03}$, $N_{04}$ and $N_{05}$ to bit lines BL0, BL1, BL2, BL3, BL4 and BL5, respectively. Likewise, select gate layer SG4 may be used to selectively couple NAND strings $N_{40}$, $N_{41}$, $N_{42}$, $N_{43}$, $N_{44}$ and $N_{45}$ to bit lines BL0, BL1, BL2, BL3, BL4 and BL5, respectively. Bit lines BL0, BL1, BL2, BL3, BL4 and BL5 may be tungsten or other conductive material.

The "source" ends of NAND strings $N_{00}$, $N_{01}$, . . . , $N_{55}$ are coupled to active regions AR0, AR1, . . . , AR5 via NAND string contacts 134 (e.g., highly doped polysilicon plugs, such as n+ polysilicon plugs). In particular, NAND strings $N_{00}$, $N_{10}$, $N_{20}$, $N_{30}$, $N_{40}$ and $N_{50}$ are coupled to active region AR0, NAND strings $N_{01}$, $N_{11}$, $N_{21}$, $N_{31}$, $N_{41}$ and $N_{51}$ are coupled to active region AR1, NAND strings $N_{02}$, $N_{12}$, $N_{22}$, $N_{32}$, $N_{42}$ and $N_{52}$ are coupled to active region AR2, NAND strings $N_{03}$, $N_{13}$, $N_{23}$, $N_{33}$, $N_{43}$ and $N_{53}$ are coupled to active region AR3, NAND strings $N_{04}$, $N_{14}$, $N_{24}$, $N_{34}$, $N_{44}$ and $N_{54}$ are coupled to active region AR4, and NAND strings $N_{05}$, $N_{15}$, $N_{25}$, $N_{35}$, $N_{45}$ and $N_{55}$ are coupled to active region AR5. NAND string contacts 134 are separated from one another and from source lines SL0, SL1, . . . , SL5 by dielectric material 136 (e.g., $SiO_2$ or other dielectric material).

Source lines SL0, SL1, . . . , SL5 may include a stack of material layers, such as shown in FIGS. 2C-2D. In an embodiment, each of source lines SL0, SL1, . . . , SL5 include a multi-layer stack of a non-conductive material layer 140 (e.g., an etch stop or hard mask material), a first conductive material layer 142, and a second conductive material layer 144. For example, non-conductive material layer 140 may be a nitride, first conductive material layer 142 may be tungsten (W), and second conductive material layer 144 may be highly doped polysilicon (e.g., n+ poly). In an embodiment, non-conductive material layer 140, first conductive material layer 142, and second conductive material layer 144 may be formed on a gate contact layer of a CMOS process. Other materials and processes may be used to form source lines SL0, SL1, . . . , SL5.

Source lines SL0, SL1, . . . , SL5 form multiple electrical contacts with p-well 132 where source lines SL0, SL1, . . . , SL5 overlap each of active regions AR0, AR1, . . . , AR5. For example, referring to FIG. 2C, source line SL0 forms an electrical contact to p-well 132 at a region 150 where source line SL0 overlaps active region AR0, and source line SL1 forms an electrical contact to p-well 132 at a region 152 where source line SL1 overlaps active region AR1.

Buried word lines BWL0, BWL1, . . . , BWL5 may be used to selectively couple the "source" ends of NAND strings $N_{00}$, $N_{01}$, . . . , $N_{55}$ to one of source lines SL0, SL1, . . . , SL5. In an embodiment, buried word line BWL0 may be used to selectively couple source ends of NAND strings $N_{00}$, $N_{01}$, $N_{02}$, $N_{03}$, $N_{04}$ and $N_{05}$ to source line SL0; buried word line BWL1 may be used to selectively couple source ends of NAND strings $N_{10}$, $N_{11}$, $N_{12}$, $N_{13}$, $N_{14}$ and $N_{15}$ to source line SL1; buried word line BWL2 may be used to selectively couple source ends of NAND strings $N_{20}$, $N_{21}$, $N_{22}$, $N_{23}$, $N_{24}$ and $N_{25}$ to source line SL2; buried word line BWL3 may be used to selectively couple source ends of NAND strings $N_{30}$, $N_{31}$, $N_{32}$, $N_{33}$, $N_{34}$ and $N_{35}$ to source line SL3; buried word line BWL4 may be used to selectively couple source ends of NAND strings $N_{40}$, $N_{41}$, $N_{42}$, $N_{43}$, $N_{44}$ and $N_{45}$ to source line SL4; and buried word line BWL5 may be used to selectively couple source ends of NAND strings $N_{50}$, $N_{51}$, $N_{52}$, $N_{53}$, $N_{54}$ and $N_{55}$ to source line SL5.

Figure 2I:
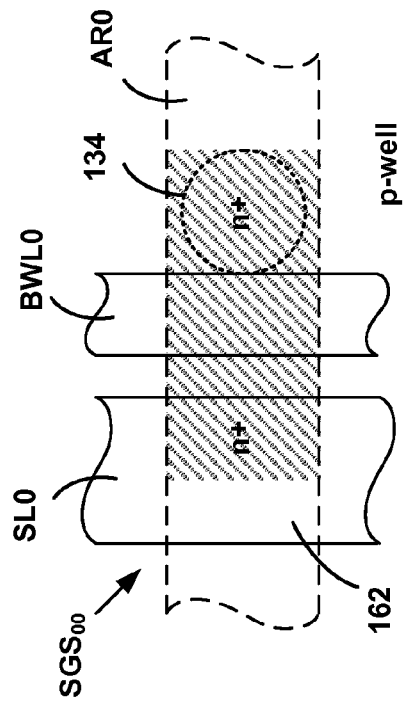
Figure 2H:
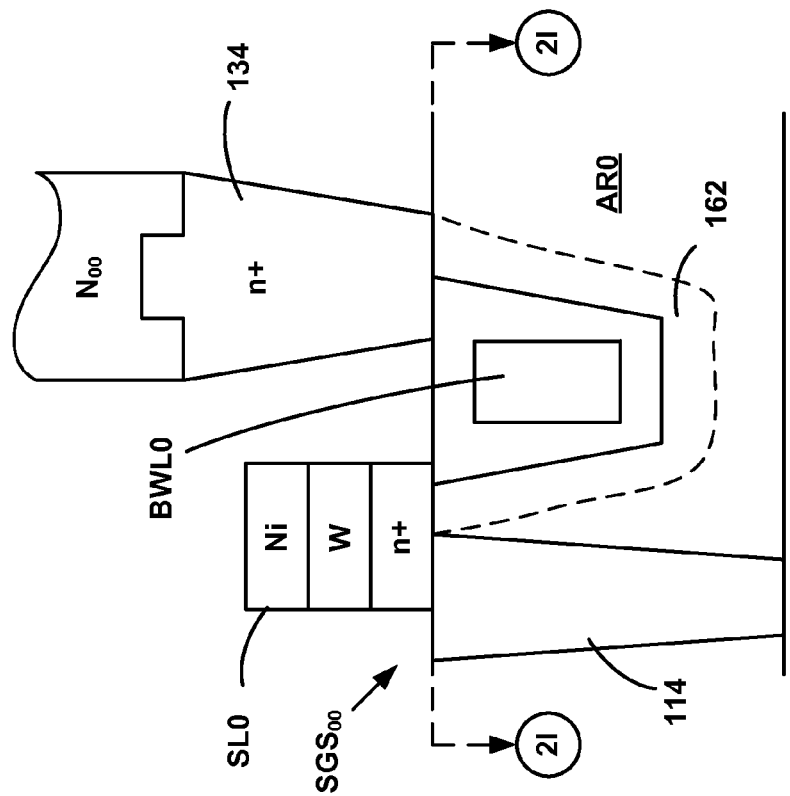

In particular, source side select gate transistors are formed where buried word lines BWL0, BWL1, ..., BWL5 and source lines SL0, SL1, ..., SL5 cross active regions AR0, AR1, ..., AR5, and where NAND string contacts 134 are coupled to active regions AR0, AR1, ..., AR5. For example, FIGS. 2H-2I depict a close-up view of region 160a of FIG. 2C, depicting source side select gate transistor $SGS_{00}$ formed where buried word line BWL0 and source line SL0 cross active region AR0, and NAND string contact 134 of vertical NAND string $N_{00}$ is coupled to active region AR0. As is known in the art, buried word line BWL0 may be selectively biased to form a conducting channel 162 between source line SL0 (e.g., the "drain" of source side select gate transistor $SGS_{00}$) and NAND string contact 134 of vertical NAND string $N_{00}$ (the "source" of source side select gate transistor $SGS_{00}$).

In this regard, buried word line BWL0 may be used to selectively couple the "source" end of NAND string $N_{00}$ to source line SL0. Similar source side select gate transistors are formed for each of NAND strings $N_{00}$, $N_{01}$, ..., $N_{55}$. Thus, buried word lines BWL0, BWL1, ..., BWL5 may be used as SGS selector devices to selectively couple the source ends of NAND strings $N_{00}$, $N_{01}$, ..., $N_{55}$ to one of source lines SL0, SL1, ..., SL5.

Figure 3A:
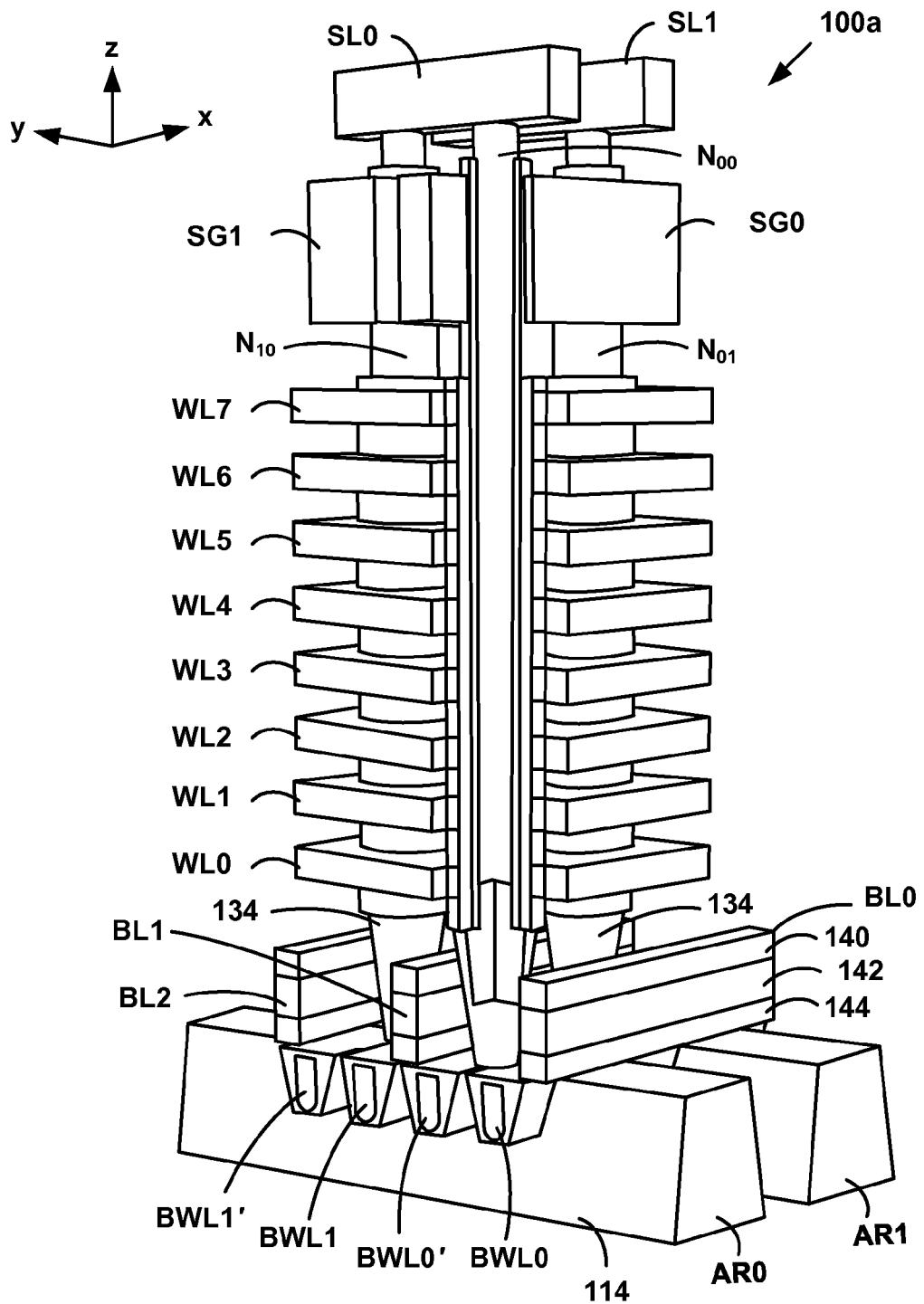
FIG. 3A is a perspective view of another embodiment of a 3D NAND non-volatile memory device.
Figure 3B:
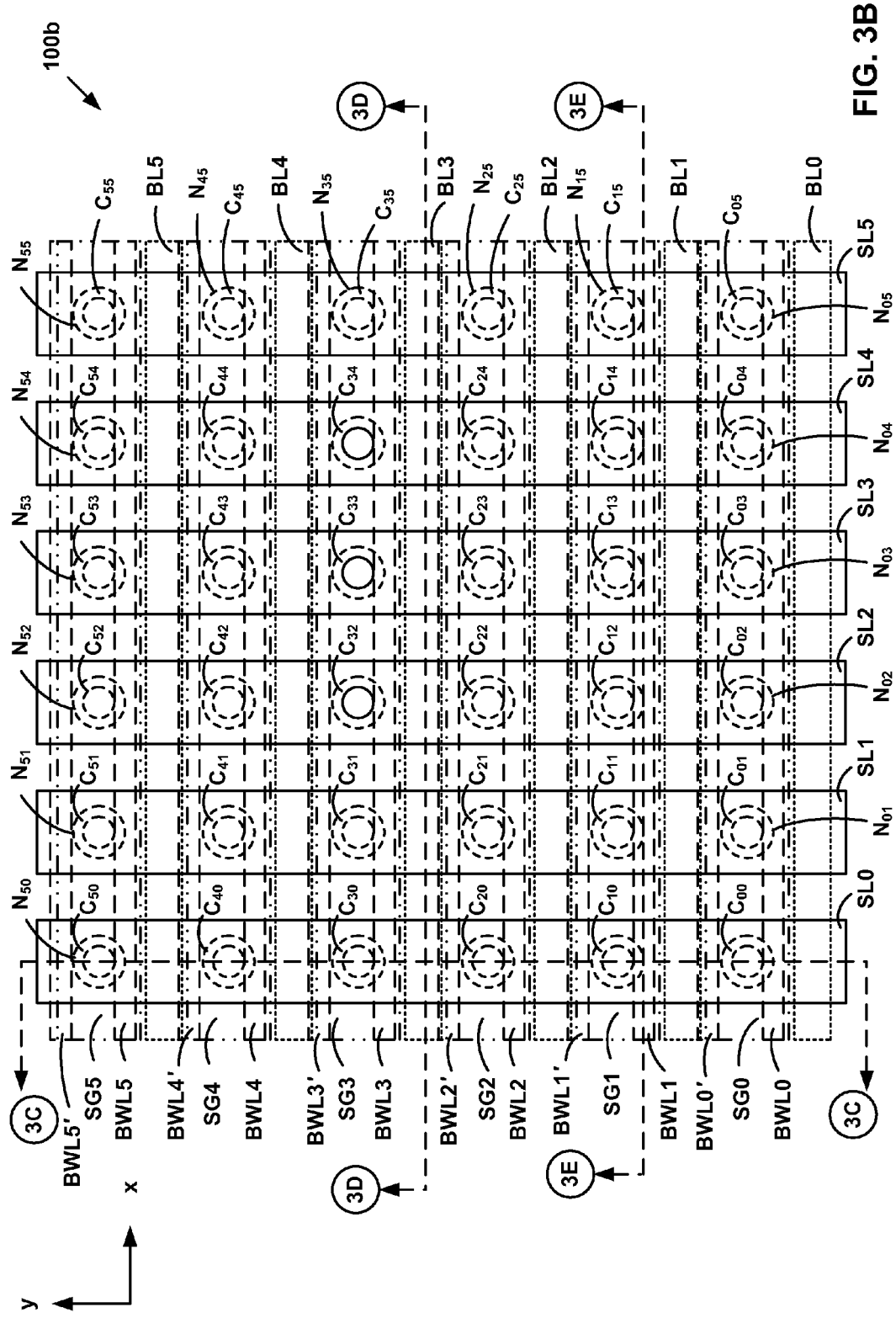
FIG. 3B illustrates a top view of the 3D NAND non-volatile memory device of FIG. 3A.
Figure 3C:
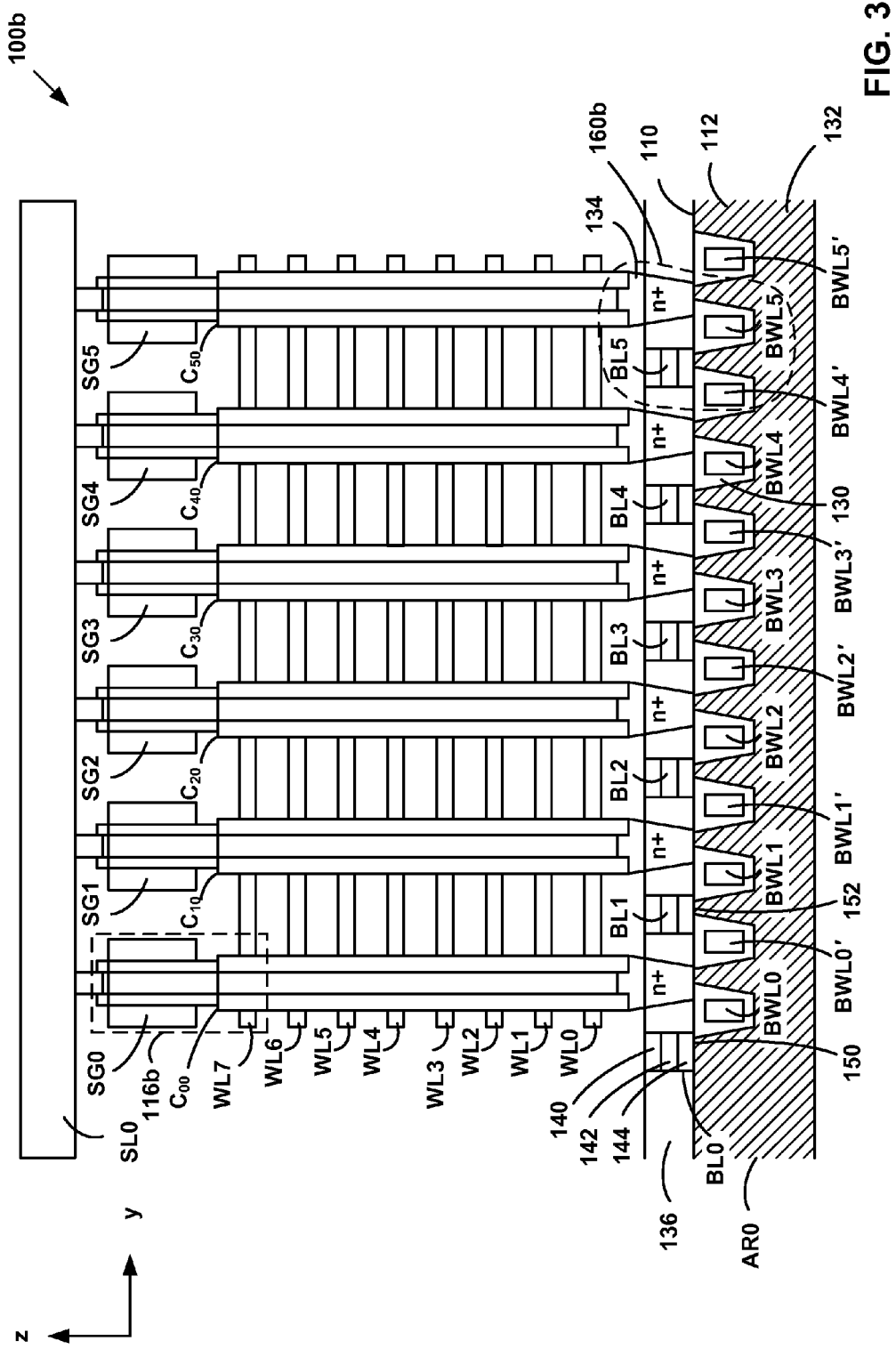
FIGS. 3C-3E illustrate various cross-sectional views of the 3D NAND non-volatile memory device of FIGS. 3A-3B.
Figure 3D:
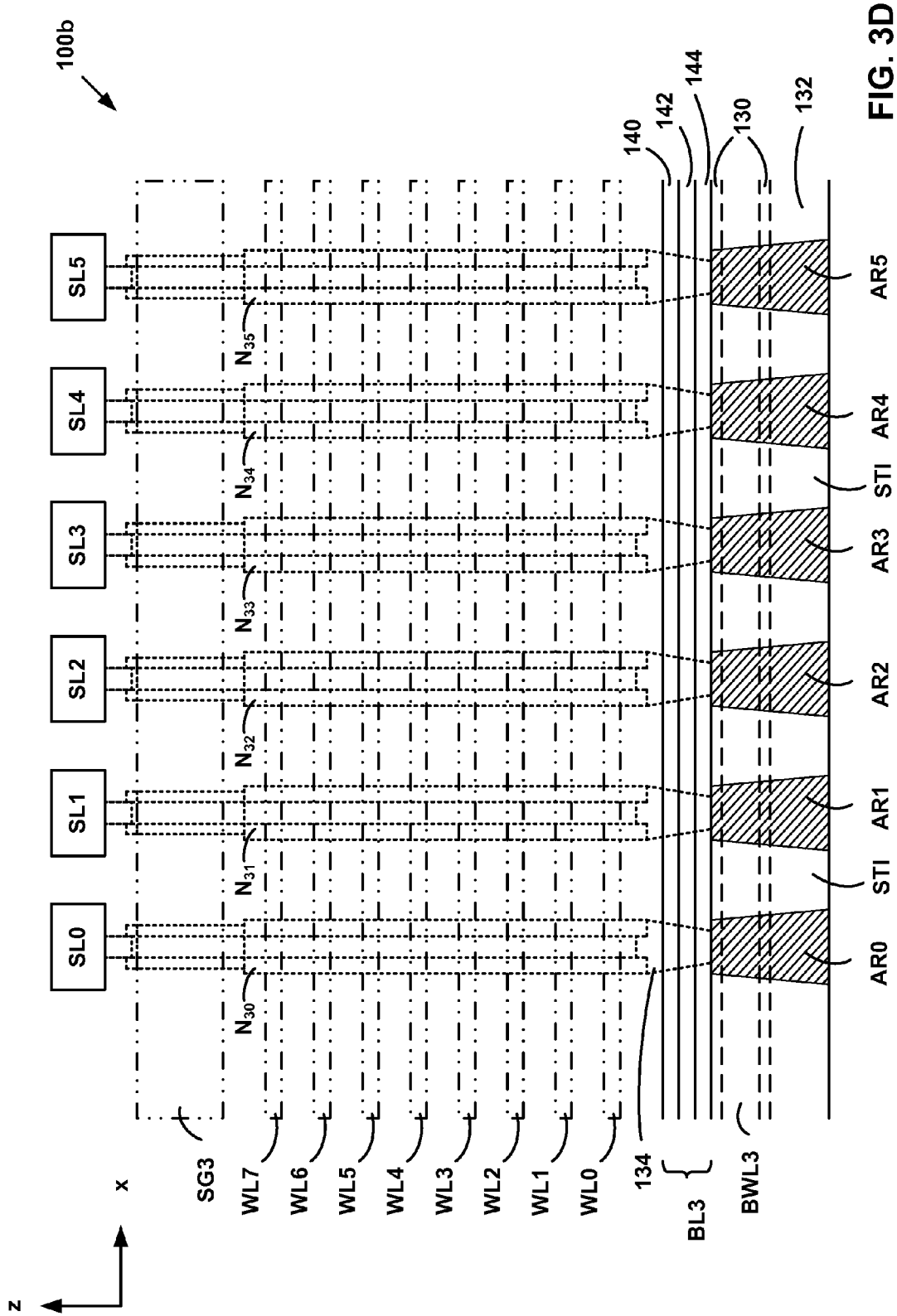
Figure 3E:
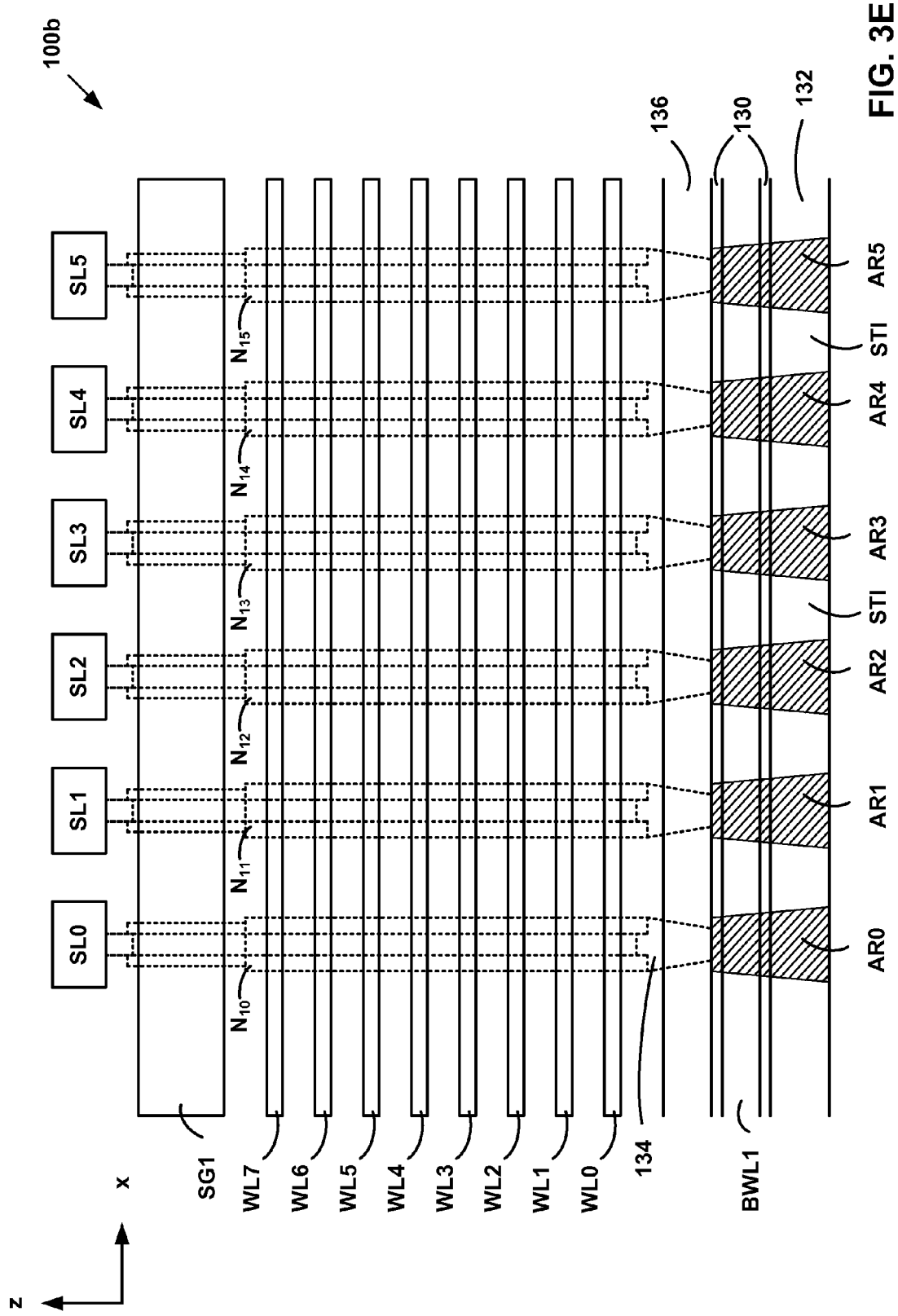

Another embodiment of a 3D NAND non-volatile memory device with buried word line selectors is shown in FIGS. 3A-3I. FIG. 3A illustrates a perspective view of a portion of 3D NAND non-volatile memory device 100b. FIG. 3B illustrates a top view of 3D NAND non-volatile memory device 100b, FIGS. 3C-3E illustrate various cross-sectional views of 3D NAND non-volatile memory device 100b, and FIGS. 3F-3I illustrate close-up cross-sectional views of portions of 3D NAND non-volatile memory device 100b. 3D NAND non-volatile memory device 100b includes source lines SL0, SL1, ..., SL5, vertical NAND strings $N_{00}$, $N_{01}$, ..., $N_{55}$, and bit lines BL0, BL1, ..., BL5 disposed above a surface 110 of a substrate 112, and a first set of buried word lines BWL0, BWL1, ..., BWL5 disposed below surface 110 of substrate 112. In an embodiment, source lines SL0, SL1, ..., SL5 are connected to one another at a common source node (not shown).

As shown in FIG. 3C, in an embodiment, 3D NAND non-volatile memory device 100b also includes a second set of buried word lines BWL0', BWL1', ..., BWL5' disposed below surface 110 of substrate 112. Second set of buried word lines BWL0', BWL1', ..., BWL5' are interspersed between adjacent first set of buried word lines BWL0, BWL1, ..., BWL. In an embodiment, first set of buried word lines BWL0', BWL1', ..., BWL5' are "active" buried word lines, whereas a second set of buried word lines BWL0', BWL1', ..., BWL5' are "passive" buried word lines and provide isolation between adjacent first set of buried word lines BWL0, BWL1, ..., BWL.

Substrate 112 also includes active regions AR0, AR1, ..., AR5. In this embodiment, source lines SL0, SL1, ..., SL5 are disposed above and are parallel to active regions AR0, AR1, ..., AR5, and bit lines BL0, BL1, ..., BL5 are disposed above and are parallel to buried word lines BWL0, BWL1, ..., BWL5. In addition, source lines SL0, SL1, ..., SL5 are perpendicular to buried word lines BWL0, BWL1, ..., BWL5. In other embodiments, other configurations are possible. For example, active regions AR0, AR1, ..., AR5 may be disposed at an angle relative to source lines SL0, SL1, ..., SL5, buried word lines BWL0, BWL1, ..., BWL5, and bit lines BL0, BL1, BL5.

Each of vertical NAND strings $N_{00}$, $N_{01}$, ..., $N_{55}$ includes columns $C_{00}$, $C_{01}$, ..., $C_{55}$, respectively, and alternating conductive layers and dielectric layers. Conductive layers include select gate layers SG0, SG1, ..., SG5 and word line layers WL0, WL1, ..., WL7. For example, vertical NAND string $N_{00}$ includes select gate layer SG0 and word line layers WL0, WL1, ..., WL7, each separated from adjacent conductive layers by dielectric material layers (e.g., $SiO_2$ or other dielectric material) (not shown in FIGS. 3C-3E). Likewise, NAND string $N_{10}$ includes select gate layer SG1 and word line layers WL0, WL1, ..., WL7, each separated from adjacent conductive layers by dielectric material layers (not shown in FIGS. 3C-3E). In an embodiment, word line layers WL0, WL1, ..., WL7 are perpendicular to source lines SL0, SL1, ..., SL5.

Figure 3G:
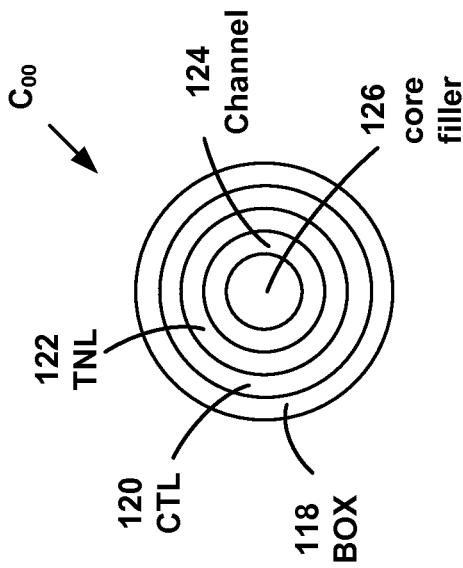
Figure 3F:
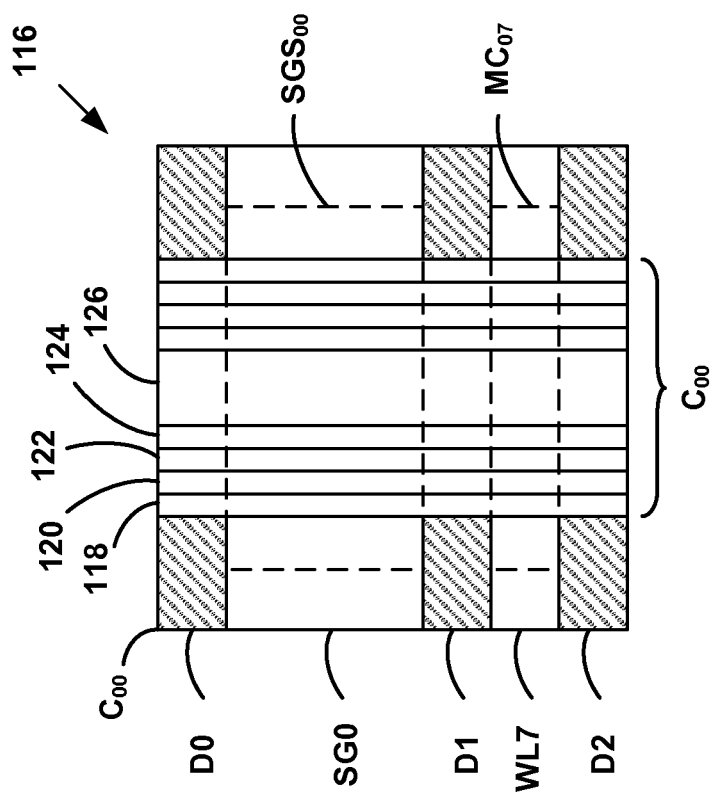

FIGS. 3F-3G depict a close-up view of region 116b of column $C_{00}$ of FIG. 3C, showing a source side select gate transistor $SGS_{00}$ and a memory cell $MC_{07}$. Region 116b shows portions of dielectric material layers D0, D1 and D2, select gate layer SG0, and word line layer WL7. Each of columns $C_{00}$, $C_{01}$, ..., $C_{55}$, includes a number of layers which are deposited along the sidewalls of the column. These layers may include oxide-nitride-oxide and polysilicon layers which may be deposited (e.g., using atomic layer deposition or other technique). For example, a block oxide (BOX) can be deposited as layer 118, a nitride such as SiN as a charge trapping layer (CTL) can be deposited as layer 120, a tunnel oxide (TNL) can be deposited as layer 122, a polysilicon body or channel (CH) can be deposited as layer 124, and a core filler dielectric can be deposited as region 126. Additional memory cells are similarly formed throughout columns $C_{00}$, $C_{01}$, ..., $C_{55}$. In the embodiment shown in FIGS. 3A-3G, each of columns $C_{00}$, $C_{01}$, ..., $C_{55}$ has a hollow cylinder shape. In other embodiments, each of columns $C_{00}$, $C_{01}$, ..., $C_{55}$ may have a solid, rod shape.

Referring again to FIGS. 3A-3E, buried word lines BWL0, BWL1, ..., BWL5 are disposed in dielectric trenches 130 (e.g., $SiO_2$ STI trenches) formed in a doped well 132 (e.g., p-well) in substrate 112. Persons of ordinary skill in the art will understand that three-dimensional NAND device 100b may include more or fewer source lines SL0, SL1, ..., SL5, vertical NAND strings $N_{00}$, $N_{01}$, ..., $N_{55}$, bit lines BL0, BL1, ..., BL5, and buried word lines BWL0, BWL1, ..., BWL5 than depicted in FIGS. 3A-3E.

Select gate layers SG0, SG1, ..., SG5 may be used to selectively couple the "source" ends of a NAND strings $N_{00}$, $N_{01}$, ..., $N_{55}$ to one of source lines SL0, SL1, ..., SL5. For example, select gate layer SG0 may be used to selectively couple NAND strings $N_{00}$, $N_{01}$, $N_{02}$, $N_{03}$, $N_{04}$ and $N_{05}$ to source lines SL0, SL1, SL2, SL3, SL4 and SL5, respectively. Likewise, select gate layer SG4 may be used to selectively couple NAND strings $N_{40}$, $N_{41}$, $N_{42}$, $N_{43}$, $N_{44}$ and $N_{45}$ to source lines SL0, SL1, SL2, SL3, SL4 and SL5, respectively.

The "drain" ends of NAND strings $N_{00}$, $N_{01}$, ..., $N_{55}$ are coupled to active regions AR0, AR1, ..., AR5 via NAND string contacts 134. In particular, NAND strings $N_{00}$, $N_{10}$, $N_{20}$, $N_{30}$, $N_{40}$ and $N_{50}$ are coupled to active region AR0, NAND strings $N_{01}$, $N_{11}$, $N_{21}$, $N_{31}$, $N_{41}$ and $N_{51}$ are coupled to active region AR1, NAND strings $N_{02}$, $N_{12}$, $N_{22}$, $N_{32}$, $N_{42}$ and $N_{52}$ are coupled to active region AR2, NAND strings $N_{03}$, $N_{13}$, $N_{23}$, $N_{33}$, $N_{43}$ and $N_{53}$ are coupled to active region AR3, NAND strings $N_{04}$, $N_{14}$, $N_{24}$, $N_{34}$, $N_{44}$ and $N_{54}$ are coupled to active region AR4, and NAND strings $N_{05}$, $N_{15}$, $N_{25}$, $N_{35}$, $N_{45}$ and $N_{55}$ are coupled to active region AR5.

NAND string contacts 134 are separated from one another and from bit lines BL0, BL1, . . . , BL5 by dielectric material 136 (e.g., $SiO_2$ or other dielectric material).

Bit lines BL0, BL1, . . . , BL5 may include a stack of material layers, such as shown in FIGS. 3C-3D. In an embodiment, each of bit lines BL0, BL1, . . . , BL5 include a multi-layer stack of a non-conductive material layer 140 (e.g., an etch stop or hard mask material), a first conductive material layer 142, and a second conductive material layer 144. For example, non-conductive material layer 140 may be a nitride, first conductive material layer 142 may be W, and second conductive material layer 144 may be highly doped polysilicon (e.g., n+ poly). In an embodiment, non-conductive material layer 140, first conductive material layer 142, and second conductive material layer 144 may be formed on a gate contact layer of a CMOS process. Other materials and processes may be used to form bit lines BL0, BL1, . . . , BL5.

Bit lines BL0, BL1, . . . , BL5 form multiple electrical contacts with p-well 132 where bit lines BL0, BL1, . . . , BL5 overlap each of active regions AR0, AR1, . . . , AR5. For example, referring to FIG. 3C, bit line BL0 forms an electrical contact to p-well 132 at a region 150 where bit line BL0 overlaps active region AR0, and bit line BL1 forms an electrical contact to p-well 132 at a region 152 where bit line BL1 overlaps active region AR1.

Buried word lines BWL0, BWL1, . . . , BWL5 may be used to selectively couple the drain ends of NAND strings $N_{00}, N_{01}, \ldots, N_{55}$ to one of bit lines BL0, BL1, . . . , BL5. In an embodiment, buried word line BWL0 may be used to selectively couple drain ends of NAND strings $N_{00}, N_{01}, N_{02}, N_{03}, N_{04}$ and $N_{05}$ to bit line BL0; buried word line BWL1 may be used to selectively couple drain ends of NAND strings $N_{10}, N_{11}, N_{12}, N_{13}, N_{14}$ and $N_{15}$ to bit line BL1; buried word line BWL2 may be used to selectively couple drain ends of NAND strings $N_{20}, N_{21}, N_{22}, N_{23}, N_{24}$ and $N_{25}$ to bit line BL2; buried word line BWL3 may be used to selectively couple drain ends of NAND strings $N_{30}, N_{31}, N_{32}, N_{33}, N_{34}$ and $N_{35}$ to bit line BL3; buried word line BWL4 may be used to selectively couple drain ends of NAND strings $N_{40}, N_{41}, N_{42}, N_{43}, N_{44}$ and $N_{45}$ to bit line BL4; and buried word line BWL5 may be used to selectively couple drain ends of NAND strings $N_{50}, N_{51}, N_{52}, N_{53}, N_{54}$ and $N_{55}$ to bit line BL5.

In particular, drain side select gate transistors are formed where buried word lines BWL0, BWL1, . . . , BWL5 and bit lines BL0, BL1, . . . , BL5 cross active regions AR0, AR1, . . . , AR5, and where NAND string contacts 134 are coupled to active regions AR0, AR1, . . . , AR5. For example, FIGS. 3H-3I depict a close-up view of region 160b of FIG. 3C, depicting drain side select gate transistor $SGD_{50}$ formed where buried word line BWL5 and bit line BL5 cross active region AR0, and NAND string contact 134 of vertical NAND string $N_{50}$ is coupled to active region AR0. As is known in the art, buried word line BWL5 may be selectively biased to form a conducting channel 162 between bit line BL5 (e.g., the "drain" of drain side select gate transistor $SGD_{50}$) and NAND string contact 134 of vertical NAND string $N_{00}$ (the "source" of drain side select gate transistor $SGD_{50}$).

In this regard, buried word line BWL5 may be used to selectively couple the "drain" end of NAND string $N_{50}$ to bit line BL5. Similar drain side select gate transistors are formed for each of NAND strings $N_{00}, N_{01}, \ldots, N_{55}$. Thus, buried word lines BWL0, BWL1, . . . , BWL5 may be used as SGD selector devices to selectively couple the drain ends of NAND strings $N_{00}, N_{01}, \ldots, N_{55}$ to one of bit lines BL0, BL1, . . . , BL5.

In an embodiment, buried word lines BWL0, BWL1, . . . , BWL5 may be implemented using similar techniques used to fabricate buried word lines in a DRAM process. In some embodiments, 3D NAND non-volatile memory arrays may be combined with DRAM memory arrays on a single substrate, and fabricated using a single integrated circuit fabrication process.

Figure 4A:
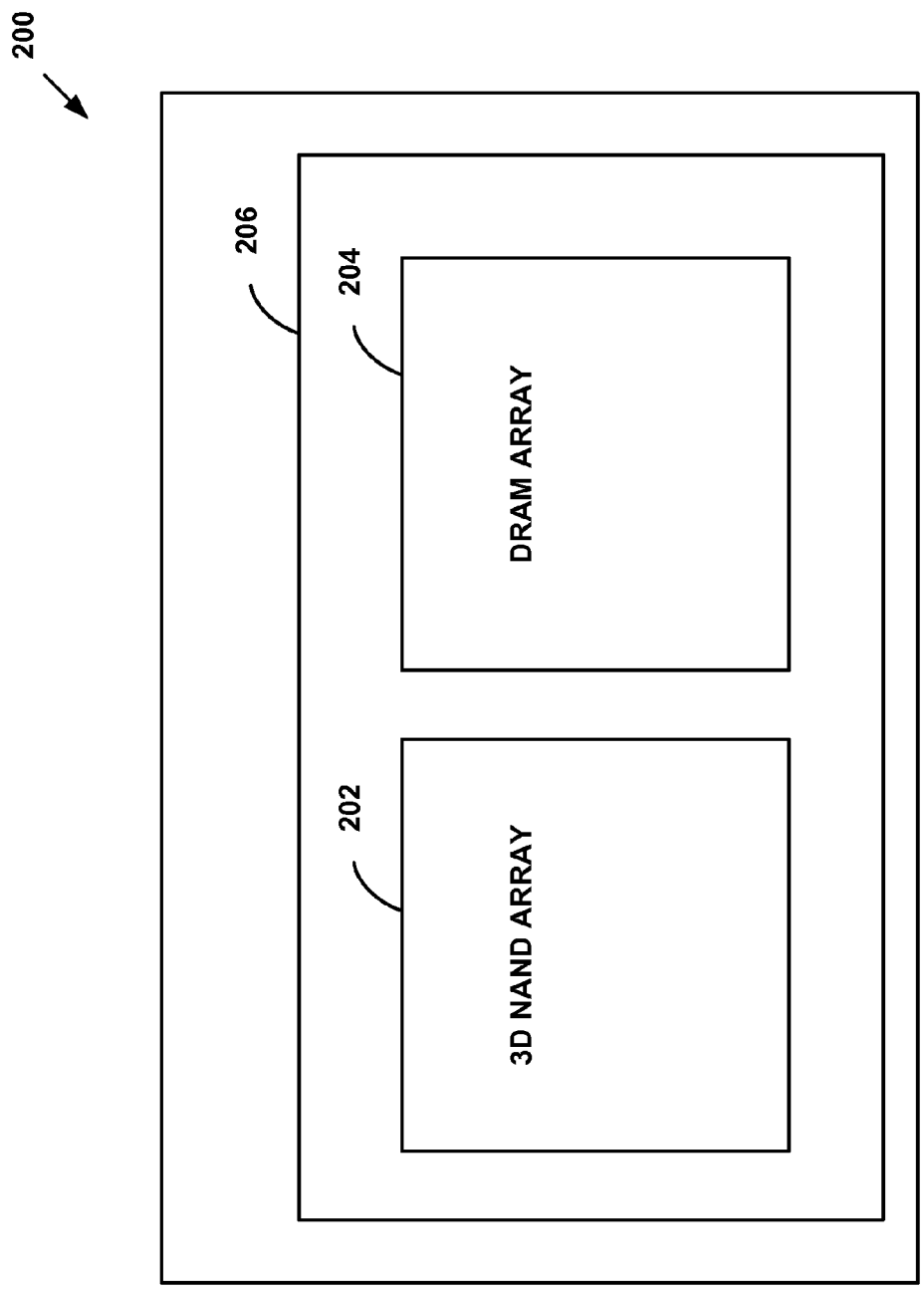
FIG. 4A is a block diagram of an integrated 3D NAND and DRAM.

For example, referring to FIG. 4A, a device 200 may include a 3D NAND array 202 and a DRAM array 204 integrated on a single substrate 206, both fabricated using a single integrated circuit fabrication process. NAND array 202 may include 3D NAND memory devices, such as 3D NAND non-volatile memory devices 100a or 100b, described above. In such an integrated device, buried word lines may be used as SGS or SGD selector devices in 3D NAND array 202, and may be used as DRAM cell transistors in DRAM array 204.

Figure 4B:
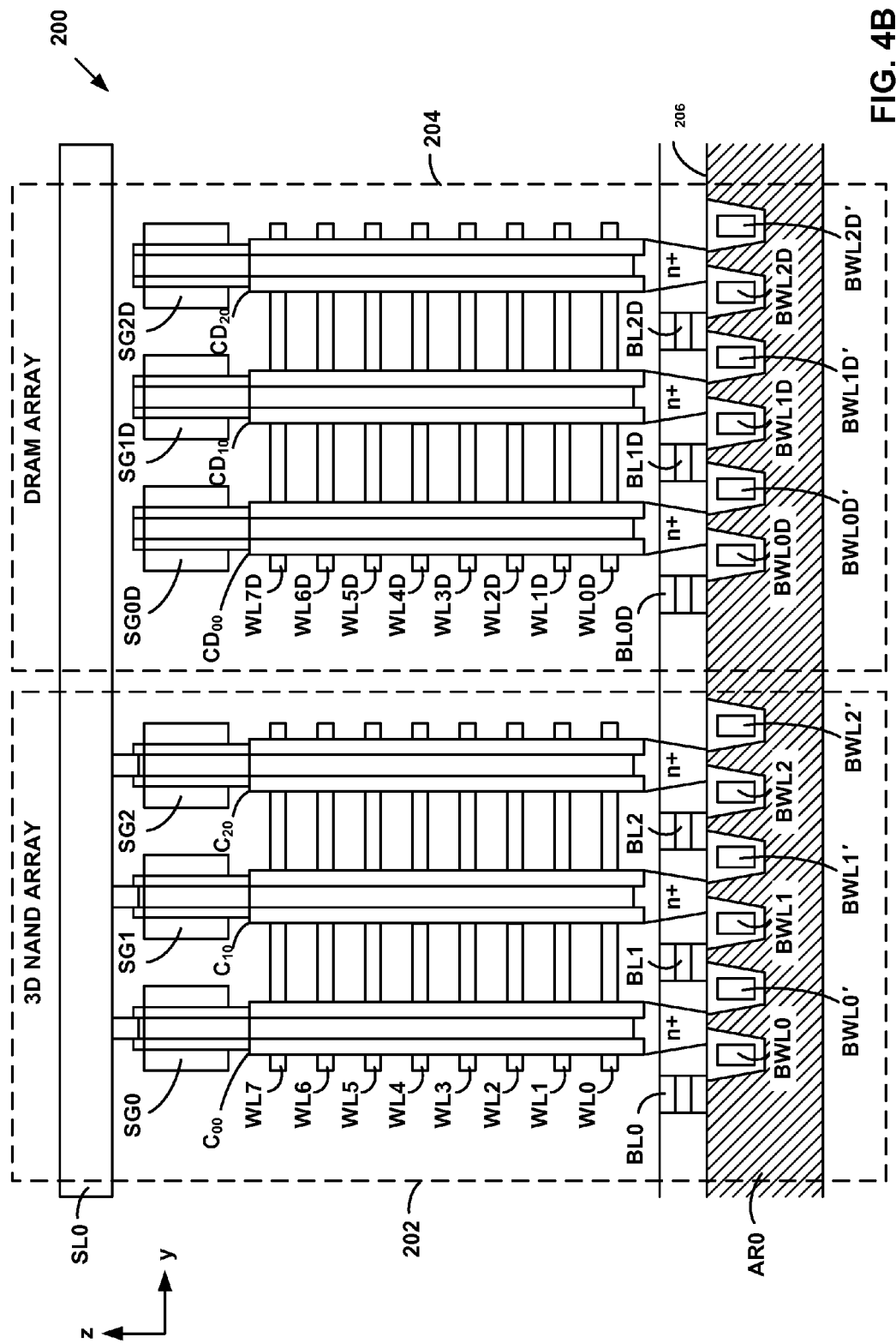
FIG. 4B is a cross-sectional view of the integrated 3D NAND and DRAM of FIG. 4A.

FIG. 4B illustrates a cross-sectional view of device 200, including 3D NAND array 202 and DRAM array 204 integrated on a single substrate 206. For simplicity, 3D NAND array 202 is depicted including three bit lines BL0, BL1 and BL2 and three select gate layers SG0, SG1, and SG2, and DRAM array 204 is depicted including three bit lines BLD0, BLD1 and BLD2 and three select gate layers SG0D, SG1D, SG2D. Persons of ordinary skill in the art will understand that 3D NAND array 202 and DRAM array 204 each may have more or fewer than three bit lines and more or fewer than three select gate layers.

As shown in FIG. 4B, columns $CD_{00}$, $CD_{01}$ and $CD_{02}$ are not connected at the top to any of the source lines (e.g., SL0). Although not depicted in FIG. 4B, in DRAM array 204, word lines (e.g., WLD0, WLD1, . . . , WLD7) and select gate layers (e.g., SG0D, SG1D, SG2D) may be electrically connected and used as a common DRAM plate electrode. In an embodiment, word lines WLD0, WLD1, . . . , WLD7 and select gate layers SG0D, SG1D, SG2D may be biased to a plate voltage (e.g., 3-5 V) to invert the DRAM cell node (e.g., the NAND channel 124 in columns $CD_{00}$, $CD_{01}$ and $CD_{02}$). In addition, bit lines BLD0, BLD1 and BLD2 may be biased to a bit line voltage (e.g., 0-1V).

In 2D NAND memory devices, the p-well substrate is biased at a high voltage to erase the storage elements (memory cells). In contrast, a 3D stacked non-volatile memory device such as 3D NAND non-volatile memory devices 100a and 100b do not have a substrate. One approach to erasing is to generate gate induced drain leakage (GIDL) current to charge up the channel, raise the channel potential to an erase voltage, and maintain this channel potential during erase. In previously known 3D NAND stacked non-volatile memory devices, the select gate transistors SGD and SGS are used to generate a sufficient amount of GIDL current to charge up the floating body of the NAND string in a reasonable time frame.

In an embodiment, bottom word lines of 3D NAND non-volatile memory devices 100a or 100b may be used as hole generators using GIDL. For example, word line WL0 of 3D NAND non-volatile memory devices 100a or 100b may be biased under conditions which generate GIDL.

GIDL hole current for erase is needed for charge trap layer cells, and may be generated either from the top of a 3D NAND non-volatile memory device via biasing the BL or SL to Verase, and the top SGD or top SGS gate to a voltage Verase-Vgidl, where e.g., Verase=20V and Vgidl=8V. In case of floating gate cells, no GIDL hole generation is needed. Accordingly GIDL can be generated from the bottom of 3D NAND non-volatile memory devices 100a or 100b by biasing p-well 132 to Verase, and floating SGS or SGD gate as well as SL or BL. In this latter case, the bottom n+ junction is charged up to Verase via the p-well 132 bias. GIDL is generated from this n+ junction if the first bottom word line (e.g., WL0) is biased to, for example Verase-Vgidl=12V.

Figure 5A:
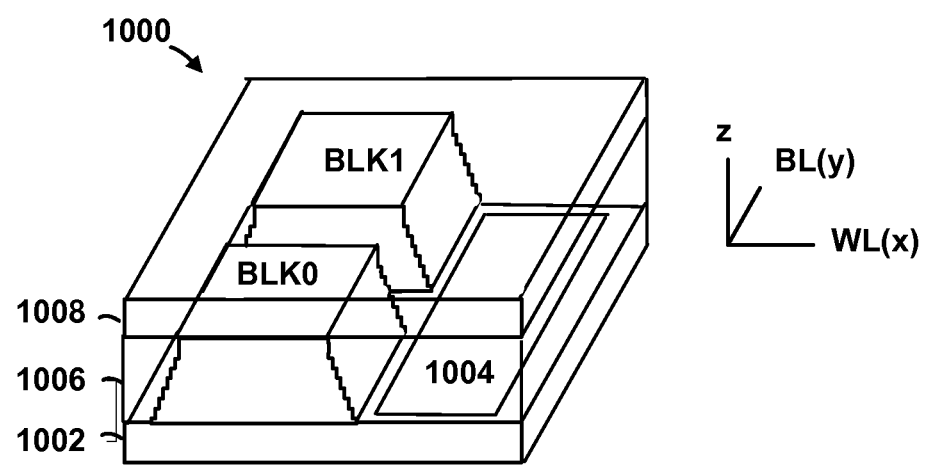
FIG. 5A is a perspective view of a 3D stacked non-volatile memory device.

FIG. 5A is a perspective view of a 3D stacked non-volatile memory device 1000. Memory device 1000 includes a substrate 1002, which includes example blocks BLK0 and BLK1 of memory cells and a peripheral area 1004 with circuitry for use by blocks BLK0 and BLK1. Substrate 1002 also may include circuitry (not shown) under blocks BLK0 and BLK1, and one or more lower metal layers which are patterned in conductive paths (not shown) to carry signals of the circuitry. Blocks BLK0 and BLK1 are formed in an intermediate region 1006 of memory device 1000. In an upper region 1008 of memory device 1000, one or more upper metal layers are patterned in conductive paths (not shown) to carry signals of the circuitry. Each of blocks BLK0 and BLK1 includes an array of 3D NAND stacked memory cells (e.g., 3D NAND non-volatile memory devices 100a and/or 100b of FIGS. 2A-3I), where alternating levels of the stack represent word lines. Although two blocks BLK0 and BLK1 are depicted as an example, additional blocks can be used, extending in the x- and/or y-directions.

In example embodiments, the x-direction represents a direction in which signal paths to word lines extend in the one or more upper metal layers (a word line direction), and the y-direction represents a direction in which signal paths to bit lines extend in the one or more upper metal layers (a bit line direction). The z-direction represents a height of memory device 1000.

Figure 5B:
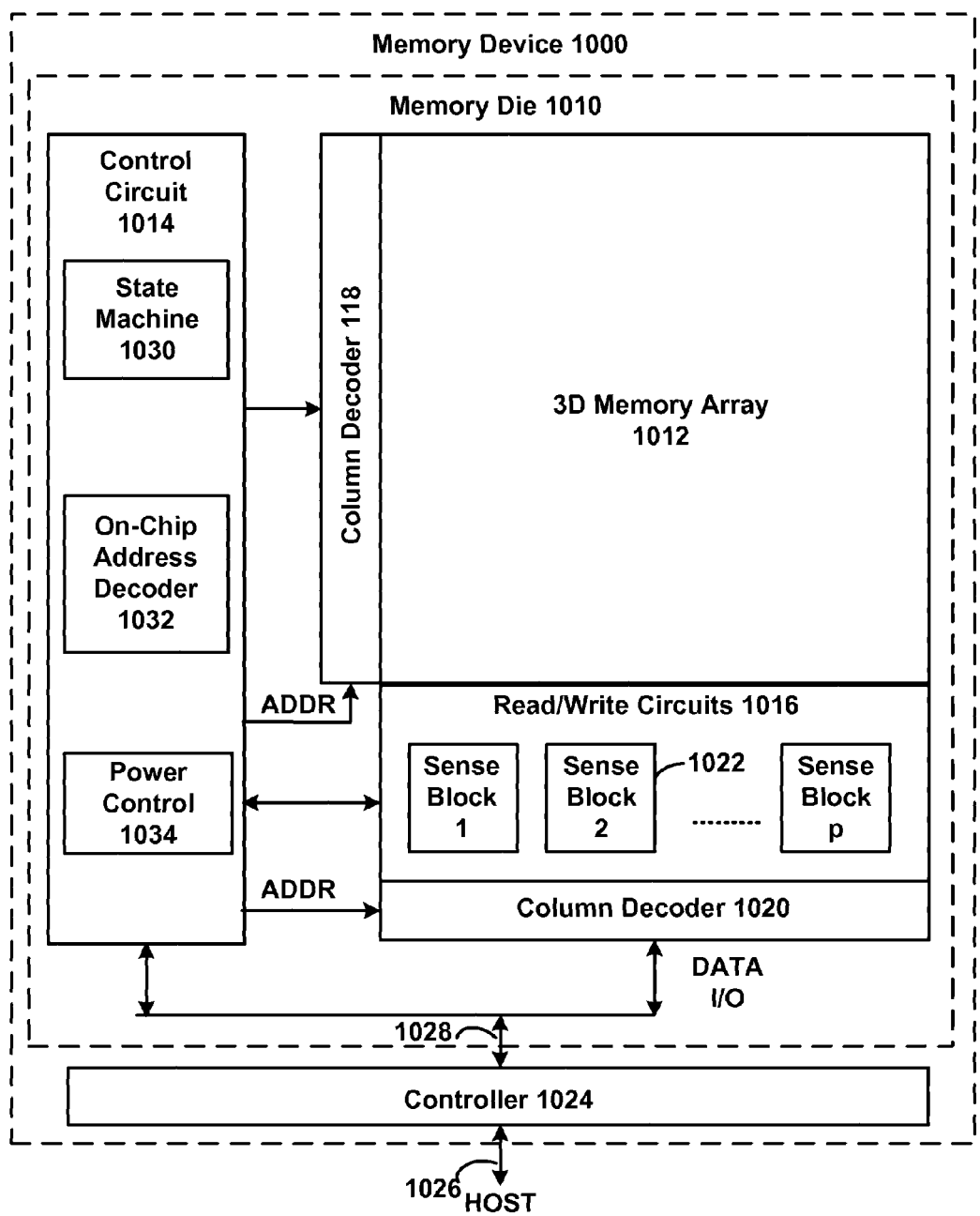
FIG. 5B is a functional block diagram of the 3D stacked non-volatile memory device of FIG. 4A.

FIG. 5B is a functional block diagram of memory device 1000 of FIG. 5A. Memory device 1000 may include one or more memory die 1010. Memory die 1010 includes a 3D memory array 1012 of memory cells, e.g., including blocks BLK0 and BLK1, a control circuit 1014, and read/write circuits 1016. Memory array 1012 is addressable by word lines via a row decoder 1018 and by bit lines via a column decoder 1020. Read/write circuits 1016 include multiple sense blocks 1022 (sensing circuitry) and allow a page of memory cells to be read or programmed in parallel. Typically a controller 1024 is included in the same memory device 1000 (e.g., a removable storage card) as memory die 1010. Commands and data are transferred between a host and controller 1024 via lines 1026 and between controller 1024 and memory die 1010 via lines 1028.

Control circuit 1014 cooperates with read/write circuits 1016 to perform memory operations on memory array 1012, and includes a state machine 1030, an on-chip address decoder 1032, and a power control module 1034. State machine 1030 provides chip-level control of memory operations. On-chip address decoder 1032 provides an address interface between that used by the host or a memory controller to the hardware address used by row decoder 1018 and column decoder 1020. Power control module 1034 controls the power and voltages supplied to the word lines and bit lines during memory operations. Power control module 1034 may include drivers for WLLs and WLL portions, drain- and source-side select gate drivers (referring, e.g., to drain- and source-sides or ends of a string of memory cells such as a NAND string, for instance) and source lines. Sense blocks 1022 may include bit line drivers, in one approach.

In some implementations, some of the components can be combined. In various designs, one or more of the components (alone or in combination), other than memory array 1012, can be thought of as at least one control circuit. For example, a control circuit may include any one of, or a combination of, control circuitry 1014, row decoder 1018, column decoder 1020, sense blocks 1030, read/write circuits 1016, and controller 1024, and so forth.

In another approach, a non-volatile memory system uses dual row/column decoders and read/write circuits. Access to memory array 1012 by the various peripheral circuits is implemented in a symmetric fashion, on opposite sides of the array, so that the densities of access lines and circuitry on each side are reduced by half. Thus, the row decoder is split into two row decoders and the column decoder into two column decoders. Similarly, the read/write circuits are split into read/write circuits connecting to bit lines from the bottom and read/write circuits connecting to bit lines from the top of memory array 1012. In this way, the density of the read/write modules is reduced by one half. Other types of non-volatile memory in addition to NAND flash memory can also be used.

Accordingly, it can be seen that one embodiment includes a three-dimensional stacked non-volatile memory device including a stack including alternating word line and dielectric layers and a plurality of NAND strings of memory cells formed in memory holes which extend through the layers, each memory cell including a control gate formed by one of the word line layers, and multiple selector devices, each selector device coupled to an end of a corresponding NAND string. The NAND strings are disposed above a substrate, and the selector devices are disposed in the substrate.

Another embodiment includes a method of forming a three-dimensional stacked non-volatile memory device. The method includes forming a stack including alternating word line and dielectric layers and a plurality of NAND strings of memory cells formed in memory holes which extend through the layers, each memory cell including a control gate formed by one of the word line layers, forming a plurality of selector devices, each selector device coupled to an end of a corresponding NAND string, forming the NAND strings above a substrate, and forming the selector devices in the substrate.

Still another embodiment includes a device that includes a three-dimensional NAND stacked non-volatile memory array, and a DRAM memory array. The three-dimensional NAND stacked non-volatile memory array and the DRAM memory array are integrated on a single substrate.

Still another embodiment includes a method that includes forming a three-dimensional NAND stacked non-volatile memory array on a substrate, and forming a DRAM memory array on the substrate. The three-dimensional NAND stacked non-volatile memory array and the DRAM memory array are formed using a single integrated circuit fabrication process.

The foregoing detailed description has been presented for purposes of illustration and description. It is not intended to be exhaustive or be limited to the precise form disclosed. Many modifications and variations are possible in light of the above description. The described embodiments were chosen to best explain the principles of the technology and its practical application, to thereby enable others skilled in the art to best utilize the technology in various embodiments and with various modifications as are suited to the particular use contemplated. The scope of the technology is defined by the claims appended hereto.

The invention claimed is:

1. A device comprising:
   a three-dimensional NAND stacked non-volatile memory array; and
   a DRAM memory array,
   wherein the three-dimensional NAND stacked non-volatile memory array and the DRAM memory array are integrated on a single substrate.

2. The device of claim 1, wherein the three-dimensional NAND stacked non-volatile memory array comprises alternating word line and dielectric layers and a plurality of NAND strings of memory cells formed in memory holes which extend through the layers, wherein each memory cell comprises a control gate formed by one of the word line layers.

3. The device of claim 1, further comprising first and second selector devices disposed in the substrate, wherein:
   the three-dimensional NAND stacked non-volatile memory array comprises a NAND string of memory cells disposed above the substrate, the NAND string coupled to the first selector device, and
   the DRAM memory array comprises a DRAM memory cell, the DRAM memory cells comprising the second selector device.

4. The device of claim 3, wherein each selector device comprises a buried word line.

5. The device of claim 3, the three-dimensional NAND stacked non-volatile memory array further comprising a select gate transistor comprising the first selector device.

6. The device of claim 5, wherein the select gate transistor comprises a source-side select gate transistor or a drain-side select gate transistor.

* * * * *